(12) United States Patent
Mallett

(10) Patent No.: US 10,033,400 B1
(45) Date of Patent: Jul. 24, 2018

(54) ANALOG-TO-DIGITAL CONVERTER VERIFICATION USING QUANTIZATION NOISE PROPERTIES

(71) Applicant: Schweitzer Engineering Laboratories, Inc., Pullman, WA (US)

(72) Inventor: Travis C. Mallett, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/787,420

(22) Filed: Oct. 18, 2017

(51) Int. Cl.
*H03M 1/10* (2006.01)
*H03M 3/00* (2006.01)

(52) U.S. Cl.
CPC ......... *H03M 3/378* (2013.01); *H03M 1/1071* (2013.01); *H03M 3/458* (2013.01)

(58) Field of Classification Search
CPC ..... H03M 3/378; H03M 3/458; H03M 1/1071
See application file for complete search history.

(56) References Cited

U.S. PATENT DOCUMENTS

| | | |
|---|---|---|
| 3,999,129 A | 12/1976 | Kasson |
| 4,156,430 A | 5/1979 | King |
| 4,187,466 A | 2/1980 | Kasson |
| 4,208,650 A | 6/1980 | Horn |
| 4,434,403 A | 2/1984 | Chang |
| 4,470,303 A | 9/1984 | O'Donnell |
| 4,481,629 A | 11/1984 | Hatata |
| 4,539,683 A | 9/1985 | Hahn |
| 4,795,963 A | 1/1989 | Ueno |
| 4,920,544 A | 4/1990 | Endo |
| 4,951,051 A | 8/1990 | Place |
| 5,012,244 A | 4/1991 | Wellard |

(Continued)

FOREIGN PATENT DOCUMENTS

| | | |
|---|---|---|
| CN | 101430360 | 4/2011 |
| DE | 3744132 | 7/1989 |
| EP | 1837671 | 9/2007 |

OTHER PUBLICATIONS

Siemens, Siprotec 5: Modular Hardware Design, 03 Hardware Overview SIPROTEC 5/DIGSI 5 Basic Course, Siemens Power Academy TD, Version: D_02_p. 26, Jan. 2012.

(Continued)

*Primary Examiner* — Brian Young
(74) *Attorney, Agent, or Firm* — Justin K. Flanagan; Richard M. Edge

(57) ABSTRACT

Disclosed are systems and methods for identifying and reporting failures of an analog-to-digital converter (ADC). Specifically, the systems and methods described herein evaluate quantization noise properties of ADCs, including delta-sigma ADCs and successive approximation register (SAR) ADCs, to verify functionality and/or identify failures. Quantization noise properties can be evaluated in the frequency domain by, for example, comparing RMS values, magnitudes, frequency spectrums, and the like, in various frequency bands to threshold values and/or to verify an expected noise shape. Quantization noise properties can additionally or alternatively be evaluated in the time domain by, for example, comparing counts of pulse widths, average pulse widths, and/or number of transitions within a sequence of pulses to threshold values and/or to similar identifiable characteristics in other pulse width bands.

24 Claims, 36 Drawing Sheets

Functional Diagram of a First Order Delta-Sigma Modulator

(56) References Cited

U.S. PATENT DOCUMENTS

| | | | |
|---|---|---|---|
| 5,055,846 A | 10/1991 | Welland | |
| 5,124,703 A | 6/1992 | Kaneaki | |
| 5,132,685 A | 7/1992 | DeWitt | |
| 5,144,308 A | 9/1992 | Norsworthy | |
| 5,146,202 A | 9/1992 | Kashihara | |
| 5,151,866 A | 9/1992 | Glaser | |
| 5,200,750 A | 4/1993 | Fushiki | |
| 5,379,039 A | 1/1995 | Charaska | |
| 5,432,514 A | 7/1995 | Mukuda | |
| 5,477,408 A | 12/1995 | Schweitzer | |
| 5,479,420 A | 12/1995 | Hong | |
| 5,574,453 A | 11/1996 | Nishio | |
| 5,737,961 A | 4/1998 | Hanisko | |
| 5,742,513 A | 4/1998 | Bouhenguel | |
| 5,933,453 A | 8/1999 | Lewison | |
| 5,959,562 A | 9/1999 | Wiesbauer | |
| 5,977,896 A | 11/1999 | Kohdaka | |
| 6,061,009 A | 5/2000 | Krone | |
| 6,064,326 A | 5/2000 | Krone | |
| 6,069,722 A | 5/2000 | Schlag | |
| 6,118,399 A | 9/2000 | Krone | |
| 6,157,331 A | 12/2000 | Liu | |
| 6,198,355 B1 | 3/2001 | Lindquist | |
| 6,249,238 B1 | 6/2001 | Steinlechner | |
| 6,252,531 B1 | 6/2001 | Gordon | |
| 6,275,177 B1 | 8/2001 | Ho | |
| 6,348,888 B1 * | 2/2002 | Yu | H03M 1/0634 341/143 |
| 6,362,763 B1 | 3/2002 | Wang | |
| 6,408,034 B1 | 6/2002 | Krone | |
| 6,442,195 B1 | 8/2002 | Liu | |
| 6,449,569 B1 * | 9/2002 | Melanson | H03M 3/378 341/118 |
| 6,489,907 B2 | 12/2002 | Cusinato | |
| 6,515,476 B1 | 2/2003 | Oshio | |
| 6,553,518 B1 | 4/2003 | Ware | |
| 6,651,036 B2 | 11/2003 | Petrofsky | |
| 6,765,954 B1 | 7/2004 | Eichrodt | |
| 6,768,436 B1 | 7/2004 | Chuang | |
| 6,795,005 B2 | 9/2004 | Hochschild | |
| 6,839,010 B1 | 1/2005 | Tsyrganovich | |
| 6,922,161 B2 | 7/2005 | Lee | |
| 6,934,324 B2 | 8/2005 | Yamazaki | |
| 6,972,700 B2 | 12/2005 | Kanekawa | |
| 7,009,539 B2 | 3/2006 | Okuda | |
| 7,154,422 B2 | 12/2006 | Wen | |
| 7,161,480 B2 | 1/2007 | Hammerschmidt | |
| 7,161,510 B2 | 1/2007 | Sugiyama | |
| 7,176,816 B2 | 2/2007 | Koerner | |
| 7,205,924 B2 | 4/2007 | Vemulapalli | |
| 7,254,203 B2 | 8/2007 | Gavardoni | |
| 7,286,068 B2 | 10/2007 | Stanley | |
| 7,301,489 B2 | 11/2007 | Lin | |
| 7,317,411 B1 | 1/2008 | Nanda | |
| 7,365,667 B1 | 4/2008 | Nanda | |
| 7,391,240 B2 | 6/2008 | Yamasaki | |
| 7,420,493 B2 | 9/2008 | Hochschild | |
| 7,474,247 B1 | 1/2009 | Heinks | |
| 7,479,914 B2 * | 1/2009 | Kuramochi | C07K 1/22 341/155 |
| 7,548,123 B2 | 6/2009 | Frey | |
| 7,554,473 B2 | 6/2009 | Melanson | |
| 7,557,572 B1 | 7/2009 | Hertz | |
| 7,605,731 B2 | 10/2009 | Van Veldhoven | |
| 7,626,526 B2 | 12/2009 | Philips | |
| 7,688,239 B2 | 3/2010 | Onoda | |
| 7,728,575 B1 | 6/2010 | Ozalevli | |
| 7,737,885 B2 | 6/2010 | Winkler | |
| 7,777,657 B2 | 8/2010 | Sandler | |
| 7,825,840 B2 | 11/2010 | Willig | |
| 7,834,788 B2 | 11/2010 | Azadet | |
| 7,868,798 B2 | 1/2011 | Azadet | |
| 7,915,936 B2 | 3/2011 | Chamberlin | |
| 7,969,339 B2 | 6/2011 | Clement | |
| 8,144,043 B2 | 3/2012 | Risbo | |
| 8,193,845 B2 | 6/2012 | Jian | |
| 8,330,437 B1 | 12/2012 | Hartman | |
| 8,331,581 B2 | 12/2012 | Pennock | |
| 8,392,199 B2 | 3/2013 | Otani | |
| 8,441,768 B2 | 5/2013 | Kasztenny | |
| 8,736,468 B2 | 5/2014 | Fabregas | |
| 8,756,029 B2 | 6/2014 | Bandsmer | |
| 8,866,519 B1 | 10/2014 | Hiebert | |
| 9,154,152 B1 * | 10/2015 | Chiu | H03M 1/468 |
| 9,306,585 B1 | 4/2016 | Elkholy | |
| 9,418,670 B2 | 8/2016 | Matsumura | |
| 9,490,818 B2 | 11/2016 | Perrott | |
| 9,564,914 B1 | 2/2017 | Mallett | |
| 9,584,148 B1 | 2/2017 | Mallett | |
| 9,698,809 B1 | 7/2017 | Mallett | |
| 9,748,940 B2 | 8/2017 | Jain | |
| 9,787,317 B2 | 10/2017 | Mallett | |
| 2004/0122544 A1 | 6/2004 | Komamura | |
| 2004/0163017 A1 | 8/2004 | Koga | |
| 2004/0178938 A1 | 9/2004 | Pedersen | |
| 2005/0038623 A1 | 2/2005 | Hammerschmidt | |
| 2005/0162286 A1 | 7/2005 | Melanson | |
| 2006/0120465 A1 | 6/2006 | Ganti | |
| 2007/0046517 A1 | 3/2007 | Behboodian | |
| 2007/0236239 A1 | 10/2007 | Bucksch | |
| 2007/0288832 A1 | 12/2007 | Adachi | |
| 2009/0238379 A1 | 9/2009 | Feng | |
| 2010/0164764 A1 | 7/2010 | Nayak | |
| 2011/0181312 A1 | 7/2011 | Ouslis | |
| 2011/0218755 A1 | 9/2011 | Dhayni | |
| 2012/0191388 A1 | 7/2012 | Parle | |
| 2013/0106632 A1 | 5/2013 | Petigny | |
| 2013/0169456 A1 | 7/2013 | Cheong | |
| 2013/0293402 A1 | 11/2013 | Naudet | |
| 2013/0297575 A1 | 11/2013 | Fallon | |
| 2017/0019120 A1 | 1/2017 | Mallett | |
| 2017/0207792 A1 | 7/2017 | Mallett | |

OTHER PUBLICATIONS

Etzel, M.; Jenkins, W., "Redundant residue number systems for error detection and correction in digital fiters," Acoustics, Speech and Signal Processing, IEEE Transactions on , vol. 28, No. 5, pp. 538,545, Oct. 1980. URL: http://ieeexplore.ieee.org/stamp/stamp.jsp?tp=&amumber=1163442&isnumber=26148.

Singh, M.; Koren, I., "Fault-sensitivity analysis and reliability enhancement of analog-to-digital converters," Very Large Scale Integration (VLSI) Systems, IEEE Transactions on , vol. 11, No. 5, pp. 839,852, Oct. 2001 URL: http://ieeexplore.ieee.org/stamp/stamp.jsp?tp=&amumber=1234403&isnumber=27663.

Lechner, A., et al. "Towards a Better Understanding of Failure Modes and Test Requirements of ADCs". Design, Automation and Test in Europe, 2001., IEEE, Mar. 2001.

Candy, James; Oconnell, Benjamin, "The Structure of Quantization Noise from Sigma-Delta Modulation". IEEE Transactions on Communications, Vol. Com-29, No. 9, Sep. 1981.

De Venuto, Daniela; Richardson, Andrew, "Testing High Resolution Delta Sigma ADC's by using the Noise Transfer Function". Proc. 9th IEE European Test Symposium, Corsica, France, paper I5.b.2, May 2004.

Ling, William, "Shaping Quantization Noise and Clipping Distortion in Direct-Detection Discrete Multitone". Journal of Lightwave Technology, vol. 32, No. 9, May 2014.

Cheded, L.; Akhtar, S., "A Novel and Fast 1-Bit FFT Scheme with two Dither-Quantized Channels", 12th European Signal Processing Conference 2004, IEEE, Sep. 2004.

Rolindez, Luis; et al. "A SNDR BIST for Sigma-Delta Analogue-to-Digital Converters". Proceedings of the 24th IEEE VLSI Test Symposium. IEEE. Apr. 2006.

Willsky, Alan S. "A survey of design methods for failure detection in dynamic systems." Automatica vol. 12, pp. 601-611. Pergamon Press. 1976.

Lu, A.K.; et al. "An Analog Multi-Tone Signal Generator for Built-in-Self-Test Applications". International Test Conference Proceedings 1994. IEEE Oct. 1994.

(56) References Cited

OTHER PUBLICATIONS

Aziz, Pervez M.; et al., "An Overview of Sigma-Delta Converters: How a 1-bit ADC Achieves more than 16-bit resolution". IEEE Signal Processing Magazine, pp. 61-84, Jan. 1996.

De La Rosa, Jose M.; et al. "Analysis and Experimental Characterization of Idle Tones in 2nd-Order Bandpass Sigma-Delta Modulators-A 0.8um CMOS Switched-Current Case Study". The 2001 IEEE International Symposium on Circuits and Systems 2001. IEEE. May 2001.

ABB, "Self Supervision Techniques, 670 Series Principles and Functions". Relion® 670 Series, Oct. 2009. ABB AB, Västerås, Sweden.

Eschermann, Bernhard; Terwiesch, Peter, "Continuous Self-Supervision Enhances Reliability of HV Substation Protection". ABB Review, pp. 19-24, Feb. 1996.

Texas Instruments, "AMC1305x High-Precision, Reinforced Isolated Delta-Sigma Modulators". Data Sheet, Jun. 2014. Revised Mar. 2017., Texas Instruments Incorporated. Dallas, Texas.

ABB, "Feeder Protection Relay REF 610". Product Guide, Issued Feb. 2007. Revised Apr. 2007. ABB Oy, VAASA, Finland.

Janssen, E.; Van Roermund, A., "Basics of Sigma-Delta Modulation." In: Look-Ahead Based Sigma-Delta Modulation. Analog Circuits and Signal Processing. Springer, Dordrecht, 2011.

Beresh, Bob, "IEEE PSRC "I" SC WG22 and WG27 Updates." Presentation. HydroOne, Mar. 25, 2014.

Garcia, Julian; Rusu, Ana, "Built-in Self Calibration for Process Variation in Single-Loop Continuous-Time Sigma-Delta Modulators." 17th IEEE International Conference on Electronics, Circuits, and Systems. IEEE, Dec. 2010.

Reiss, Joshua D.; Sandler, Mark, "Detection and Removal of Limit Cycles in Sigma Delta Modulators." IEEE Transactions on Circuits and Systems, vol. 55, No. 10. IEEE, Nov. 2008.

Chen, Robert W.; Hwang, Frank K., "Failure Distributions of Consecutive-k-out-of-n:F Systems." IEEE Transasctions on Reliability, Vol. R-34, No. 4, IEEE, Oct. 1985.

Keramat, M., "Functionality of Quantization Noise in Sigma-Delta Modulators." Proceedings of the 43rd IEEE Midwest Symposium on Circuits and Systems. IEEE, Aug. 2000.

General Electric, "P154/P253 Feeder and Motor Protection Relay." Protection Product Solutions. General Electric Corporation, 2015.

Gonzalez, Enrique Perez; Reiss, Joshua, "Idle Tone Behavior in Sigma Delta Modulation." AES 122nd Convention. Audio Engineering Society, May 2007.

Ksentini, N.; et al. "Modeling of Quantization Noise in Switched-Current Sigma-Delta Modulator Using VHDL-AMS." °Presented at MIZDES 2006 International Conference, Gdynia, Poland. Jun. 2006. Department of Microelectronics & Computer Science, Technical University of Lodz, 2006.

Kang, Kyung; Stubberud, Peter. "Overload Analysis of Continuous Time Sigma Delta Modulators." 2015 IEEE 58th International Midwest Symposium on Circuits and Systems. IEEE, Aug. 2015.

ALSTOM, "MiCOM P341 Technical Manual Interconnection Protection Relay." ALSTOM, 2011.

Daoud, Omar; et al., "Peak Detection Using Wavelet Transform." International Journal of Computer Networks & Communications, vol. 6, No. 4, pp. 107-114. Jul. 2014.

Kumm, John J.; et. Al., "Philosophies for Testing Protective Relays." 20th Annual Western Protective Relay conference, Oct. 1993.

Fischer, Godi; Hyun, Deokhwan, "Quantization Noise and Limit Cycle Patterns in Single-Bit Delta-Sigma Modulators." IEEE Instrumentation and Measurement Technology Conference. IEEE, May 2001.

Wisland, Dag T.; et. Al., "Quantization Noise in the First-Order Non-Feedback Delta-Sigma Modulator with DC-Input." Proceedings of the 2003 International Symposium on Circuits and Systems. IEEE, May 2003.

Redfern, Arthur J.; Shi, Kun, "Quantization Noise Shaping for Information Maximizing ADCs." 2014 IEEE International Conference on Acoustic, Speech and Signal Processing. IEEE, May 2014.

Gray, Robert M. "Quantization Noise Spectra." IEEE Transactions on Information Theory, vol. 36, No. 6, pp. 1220-1244. IEEE, Nov. 1990.

Rangan, Sundeep; Leung, Bosco, "Quantization Noise Spectrum of Double-Loop Sigma-Delta Converter with Sinusoidal Input." IEEE Transactions on Circuits and Systems-II: Analog and Digital Signal Processing, vol. 41, No. 2, pp. 168-173. IEEE, Feb. 1994.

ABB, "Feeder Protection and Control REF630 Prodcut Guide". Relion® 630 Series. May 2011. ABB Oy, VAASA, Finland.

Park, Sangil, "Motorola Digital Signal Processors: Principles of Sigma-Delta Modulation for Analog-to-Digital Converters." Motorola, Apr. 1990.

Siemens, "Generator Protection/7UM61, SIPROTEC 4 7UM61 multifunction generator and motor protection relay" Edition No. 7, Siemens, Jul. 25, 2013.

Siemens, "Distance Protection/7SA6, SIPROTEC 4 7SA6 distance protection relay for all voltage levels" Edition No. 7, Siemens, Jul. 25, 2013.

\* cited by examiner

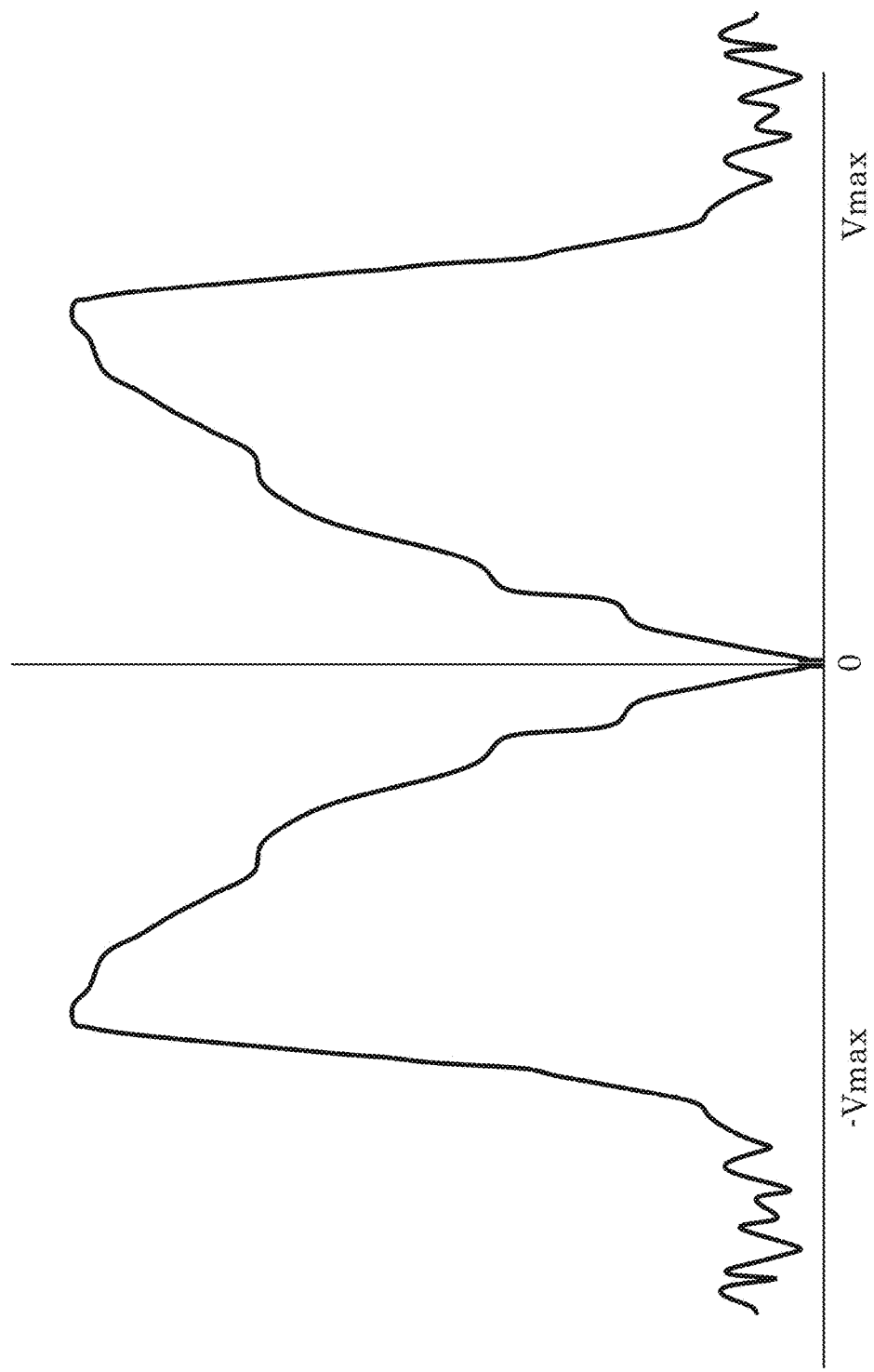

Signal and Quantization Noise Filters
.LIB OPAMP.SUB
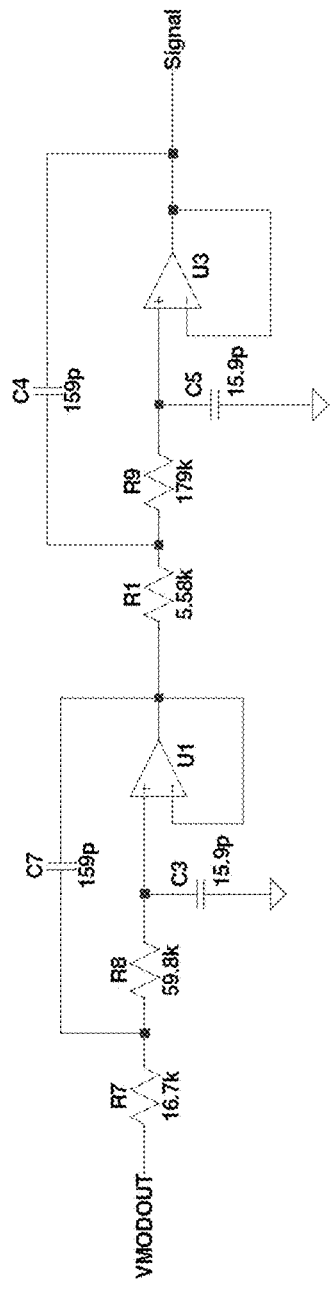
100 kHz Lowpass Filter, 400kHz stopband
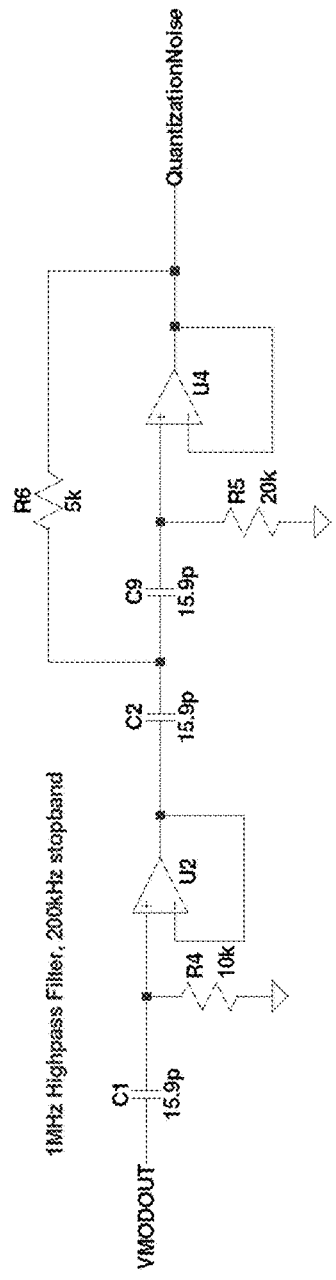
1MHz Highpass Filter, 200kHz stopband
FIG. 21B 10 Pulses of Width 1 (o)
3 Pulses of Width 2 (X)
1 Pulse of Width 3 (I)

Sample Number

Pulse Width (modulator samples)

19 Pulses of Width 1

Sample Number

9 Pulses of Width 2

Sample Number

6 Pulses of Width 3

Sample Number

5 Pulses of Width 4

Sample Number

ANALOG-TO-DIGITAL CONVERTER VERIFICATION USING QUANTIZATION NOISE PROPERTIES

TECHNICAL FIELD

This disclosure relates to validation and measurement systems and methods in electric power delivery systems. More particularly, this disclosure relates to analog-to-digital converter failure identification by verifying quantization noise properties.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

FIG. 17 illustrates a measured shape of modulator noise versus input magnitude, according to one embodiment.

FIG. 21B illustrates an example of signal and quantization noise filters.

DETAILED DESCRIPTION

Figure 1:
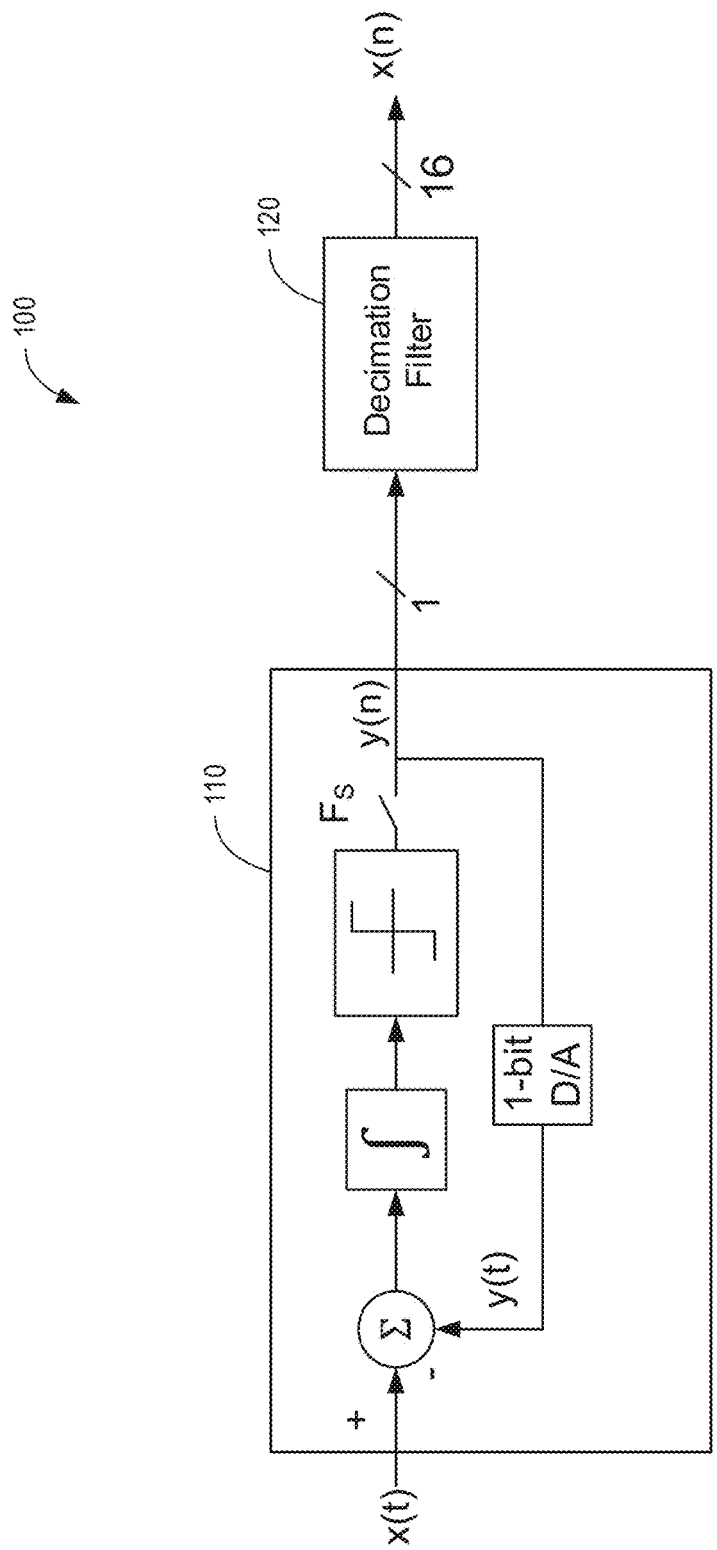
FIG. 1 illustrates a block diagram of a first-order sigma-delta analog-to-digital converter (ADC or A/D converter), according to one embodiment.

Protection and monitoring relays may be installed in electric power generation, transmission, and distribution facilities to detect and/or respond to overloads, short circuits, various fault conditions, and/or other anomalies. For example, large amounts of current may flow through a power line into a ground or other shorting medium in response to one or more short circuit faults. A protective relay (e.g., a digital protective relay) may be configured to detect the fault condition using an overcurrent element and trip a breaker to clear the fault. In some embodiments, protective relays may be deemed "mission critical" equipment for the integrity of the power system and the personal safety of personnel. In many embodiments and configurations of a protective relay, the reliability and proper function of a protective relay may be of utmost concern.

A protective relay may be embodied as an electronic device employing one or more of a field-programmable gate array ("FPGA"), a microcontroller, a CPU, an analog to digital converter (ADC or A/D converter), an electronic display, a communication port, and/or other electronic devices and systems. Discrete components or systems may digitize power system currents and/or voltages and/or process data associated with digitized currents and voltages using various algorithms and/or filters. A protective relay may be configured to make protection decisions based on data associated with a digitized power system currents and/or voltages, and may communicate decisions made by a protective relay to appropriate systems and/or personnel.

Decisions made by a protective relay may only be as reliable as any measurement data communicated to the protective relay from an ADC. If an ADC communicates false or inaccurate information to a protective relay without any indication of the error(s), the protective relay may respond or react erroneously based on the received false or inaccurate data. Such erroneous reporting and/or reactions may result in an unintended consequence known as an "unintended operation" (UO).

The present disclosure provides various systems and methods for ADC error checking through measurement and verification of quantization noise and associated properties. A wide variety of ADCs have definable noise characteristics that can be monitored. For example, an output of a noise-shaping ADC may be monitored to detect deviations from expected noise characteristics.

As a specific example, a delta-sigma ADC may produce a relatively large amount of high-frequency noise in a one-bit output. The noise from the delta-sigma ADC is typically attenuated by a decimation filter to produce a multi-bit, high-resolution output at a lower output data rate than the modulation frequency. However, the characteristics of the unfiltered noise from the delta-sigma ADC can be defined by a noise transfer function (NTF). The NTF is closely related to the dynamic behavior of the delta-sigma ADC.

By verifying known properties of the quantization noise of a noise-shaping ADC, a confidence in the ADC's health (or a failure of the ADC) can be determined. Determination that the ADC has failed may result in the disablement of a protective relay, activation of a backup protective relay, or other remedial action. The systems and methods described herein for detecting a failure of an ADC may be utilized in other fields of use and are not limited to power distribution and protection systems.

Noise-based verification of ADC health may be used in addition to or in conjunction with other ADC self-checking approaches, including, but not limited to: multiplexing in a known voltage, injecting a test tone, voting methods with redundant cross-checking data acquisition hardware, firmware, and/or software, transient glitch detection, etc. However, many of these alternative or additional approaches are not cost effective, inaccurate, take too long to detect a failure, and/or are not suitable for use with some types of ADCs.

Any of a wide variety of systems and methods may be adapted to perform the systems and methods described herein. In various embodiments, an intelligent electronic device ("IED") or other device may include one or more of the circuits described herein and/or implement the methods (as described via flow charts and/or block diagrams) to actively verify a digital output of an ADC and/or provide an alert when the ADC experiences or appears to be experiencing an error.

Noise-shaping ADCs, such as delta-sigma ADCs, may shape quantization noise to a specific frequency band (e.g., a high frequency band). Frequently, care is taken in the design of delta-sigma ADCs to obtain a precise noise-shaping effect that is well defined and sometimes even documented. In other instances, the noise-shaping effect can be measured and characterized. The noise-shaping effects are nonlinear as well as dynamic, and consequently the analysis can be time consuming and require a certain level of precision. However, the shape of quantization noise in delta-sigma ADCs has been well studied and the mathematical task of studying a noise transfer function for a particular ADC or family of ADCs can be performed with relative ease. Using linearizing assumptions, a typical analysis of the transfer function of a noise-shaping data converter has the following form:

$$Y(z)=S(z)X(z)+\text{NTF}(z)E(z) \qquad \text{Equation 1}$$

In Equation 1 above, Y is the converter output, S is the signal transfer function, X is the input signal, E is the quantization noise, and NTF is the noise transfer function. The signal transfer function is often a clock delay and introduces no distortion to the input signal X. This allows the input signal to pass through the converter unchanged, except for the addition of quantization error E, as shaped by the NTF. Generally, the NTF "shapes" the quantization noise to primarily reside in frequencies outside the bandwidth of the input signal X (e.g., higher frequencies).

Digital filters are frequently employed to remove the quantization noise and down-sample to a lower data rate, producing a high-resolution output. Historically, investigations into quantization noise have been aimed at suppressing the quantization noise. However, as described herein the NTF of an ADC may describe the dynamic behavior of the ADC and can be used to verify functionality.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

Most of the embodiments described herein are applicable to a wide variety of ADCs. However, many of the examples are described with respect to delta-sigma ADCs that employ a delta-sigma modulator. However, it is appreciated that the noise evaluation techniques described herein may be utilized in combination with other types of ADCs. Examples of other types of ADCs include, but are not limited to, flash ADCs, pipelined ADCs, successive approximation register (SAR) ADCs, integrated ADCs, delta-encoded ADCs, time-interleaved ADCs, ramp-compare ADCs, and the like.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates a block diagram 100 of a first-order delta-sigma analog-to-digital converter (ADC or A/D converter) 110 with a digital decimation filter 120, according to one embodiment. Due to the inherent nonlinear transfer function of the quantizer, linear approximation modeling typically incorporates a noise source.

Figure 2:
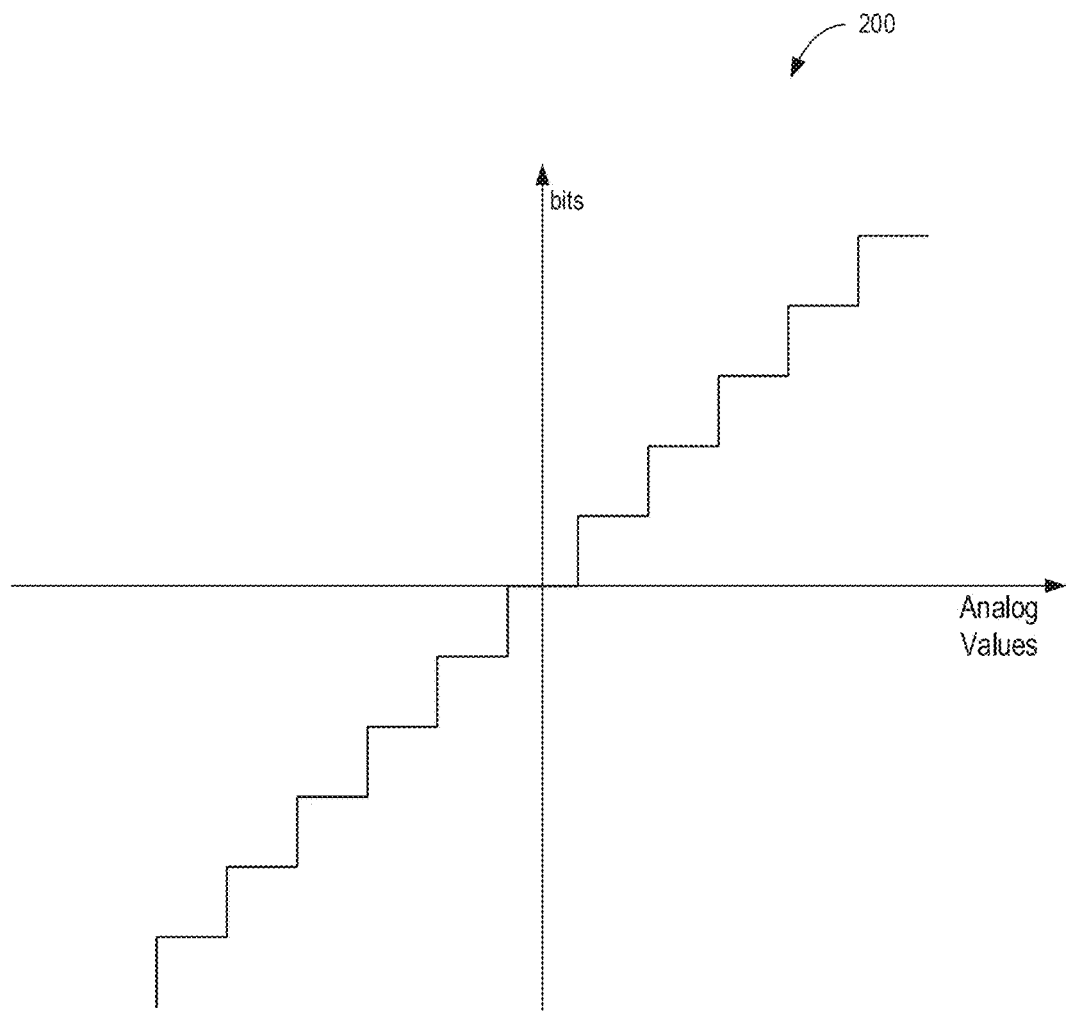
FIG. 2 illustrates a multi-bit quantizer transfer curve, according to one embodiment.

FIG. 2 illustrates a multi-bit quantizer transfer curve 200, according to one embodiment. It can be readily appreciated that an approximation of the curve with a line would introduce some error between the approximated straight line and the exact quantizer values. An equation for linear approximation that accounts for the error can be expressed as:

$$y=kx+e \qquad \text{Equation 2}$$

In Equation 2 above, y represents the output from a quantizer, x represents the input to the quantizer, e represents the error, and k represents the slope of the quantization line. For delta-sigma modulators that utilize a one-bit quantizer, the gain, k, from Equation 2 becomes ambiguous.

Figure 3:
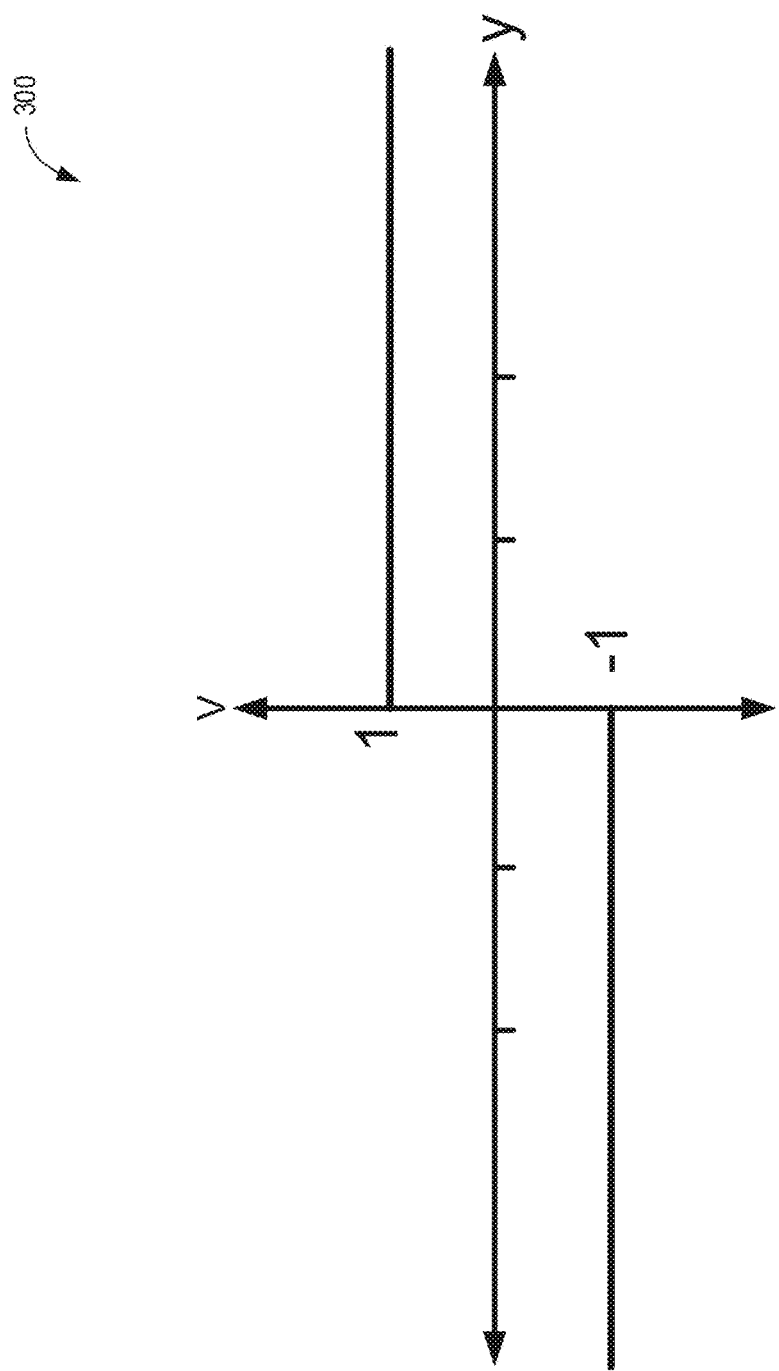
FIG. 3 illustrates a binary quantizer with an ambiguous gain, according to one embodiment.

FIG. 3 illustrates a binary quantizer with an ambiguous gain 300, according to one embodiment. For many noise-shaping modulators, a unity gain can be assumed and so an equation for linear approximation that accounts for the error can be expressed as:

$$y=x+e \qquad \text{Equation 3}$$

In Equation 3 above, y again represents the output from a quantizer, x represents the input to the quantizer, and e represents the error.

Figure 4:
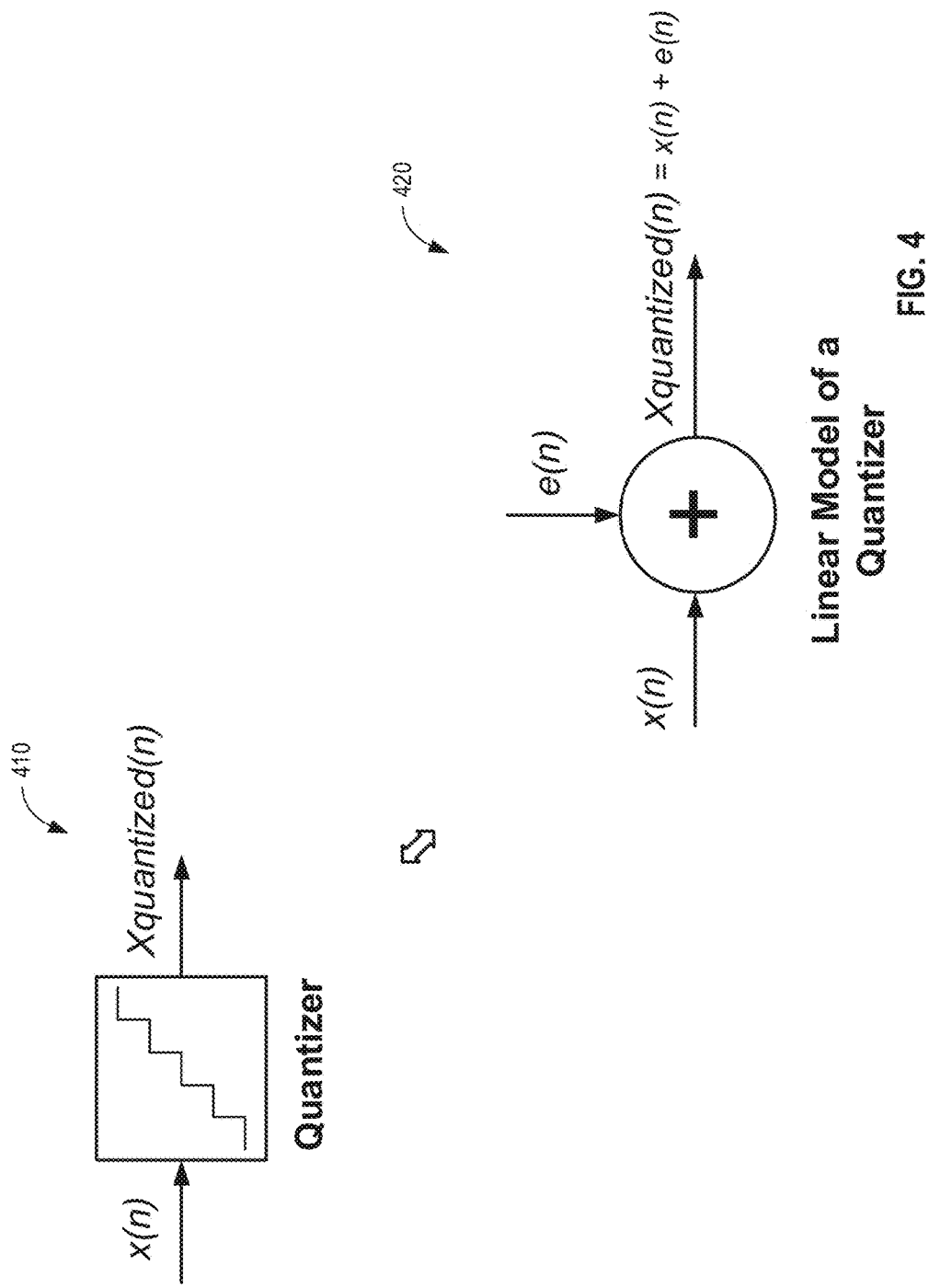
FIG. 4 illustrates a linear model for the quantizer in which the quantization error is considered an additive noise source, according to one embodiment.

FIG. 4 illustrates a linear model for the quantizer in which the quantization error is considered an additive noise source 420 as an equivalent to the nonlinear quantizer 410, according to one embodiment.

Figure 5:
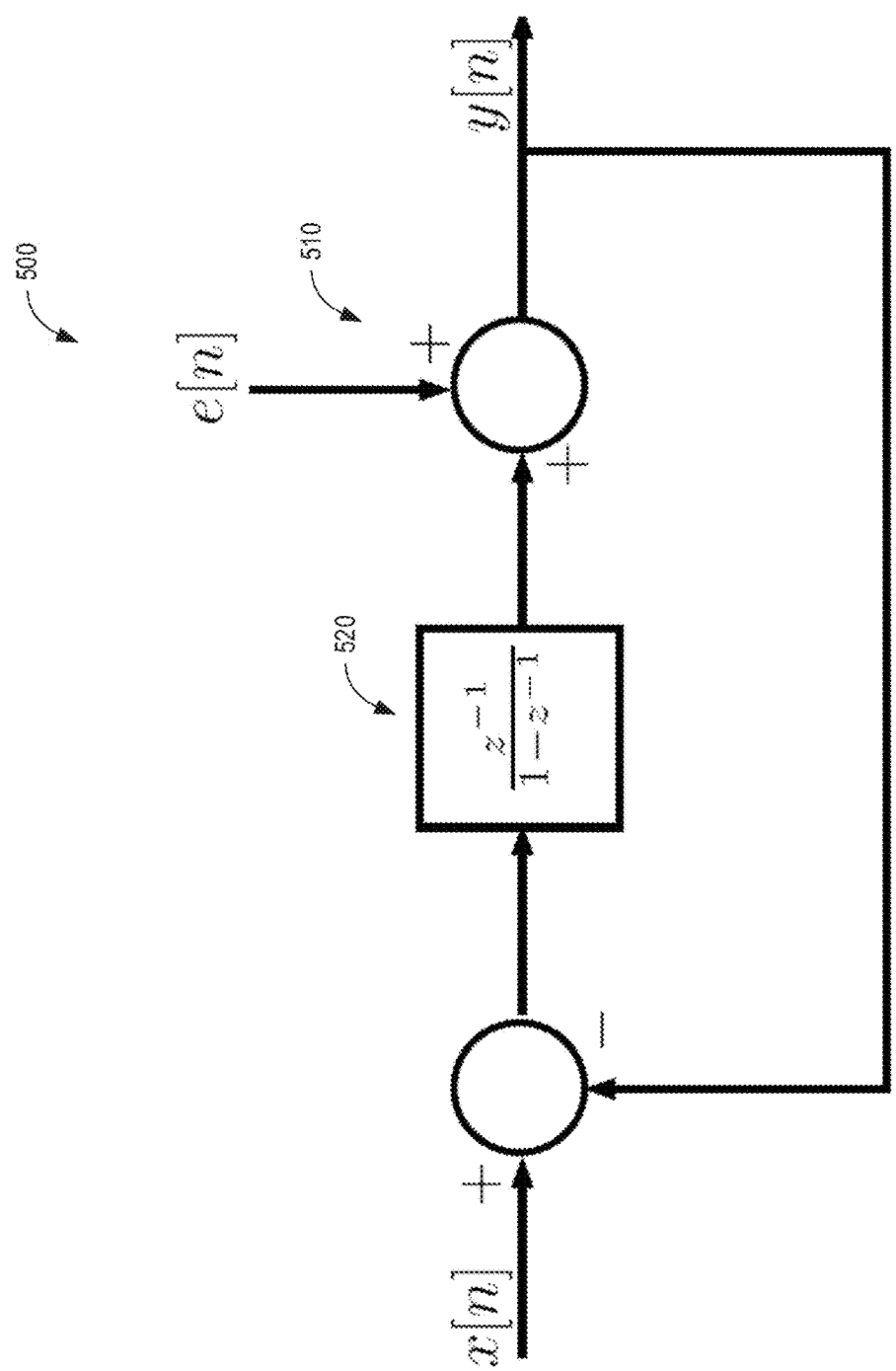
FIG. 5 illustrates a block diagram of a linear model of a first order delta-sigma modulator, according to one embodiment.

FIG. 5 illustrates a block diagram of a linear model of the noise-shaping modulator 500 of a first order delta-sigma modulator that includes the additive noise source 510 and an ideal delaying integrator transfer function in the Z-domain 520, according to one embodiment. A mathematical expression for the linearized approximation of the noise-shaping modulator 500 shown in FIG. 5 can be expressed as:

$$Y(z)=z^{-1}X(z)+(1-z^{-1})E(z) \qquad \text{Equation 4}$$

An analysis of Equation 4 reveals that X(z) passes through to the output without any distortion and only delayed by one clock period, and the error signal E(z) is multiplied by the $(1-z^{-1})$ term which performs differentiation on the error signal. This causes the error signal to be highly attenuated at low frequencies—hence the descriptor "noise-shaping" for these types of ADCs. As previously described, a filter (e.g., digital decimation filter 120, FIG. 1) can be used to filter out and/or attenuate the modulator noise.

Second-order noise-shaping modulators can be linearly approximated as well. For example, a second-order delta-sigma modulator can be approximated by similar equations, but with the integrator 520 replaced with a second-order low pass filter with a transfer function, such as:

$$A(z) = \frac{2z^{-1} - z^{-2}}{1 - 2z^{-1} + z^{-2}} \qquad \text{Equation 5}$$

Thus, the transfer function for a second-order delta-sigma modulator may be expressed as:

$$Y(z)=X(z)z^{-1}+E(z)(1-z^{-1})^2 \qquad \text{Equation 6}$$

Furthermore, a generalized transfer function for an M-order delta-sigma modulator, where M can be any integer, can be expressed as:

$$Y(z)=X(z)z^{-1}+E(z)(1-z^{-1})^M \qquad \text{Equation 7}$$

In Equations 6 and 7 above, it can be seen that increases in the order of the delta-sigma modulator result in further attenuation of the error signal at low frequencies.

Figure 6:
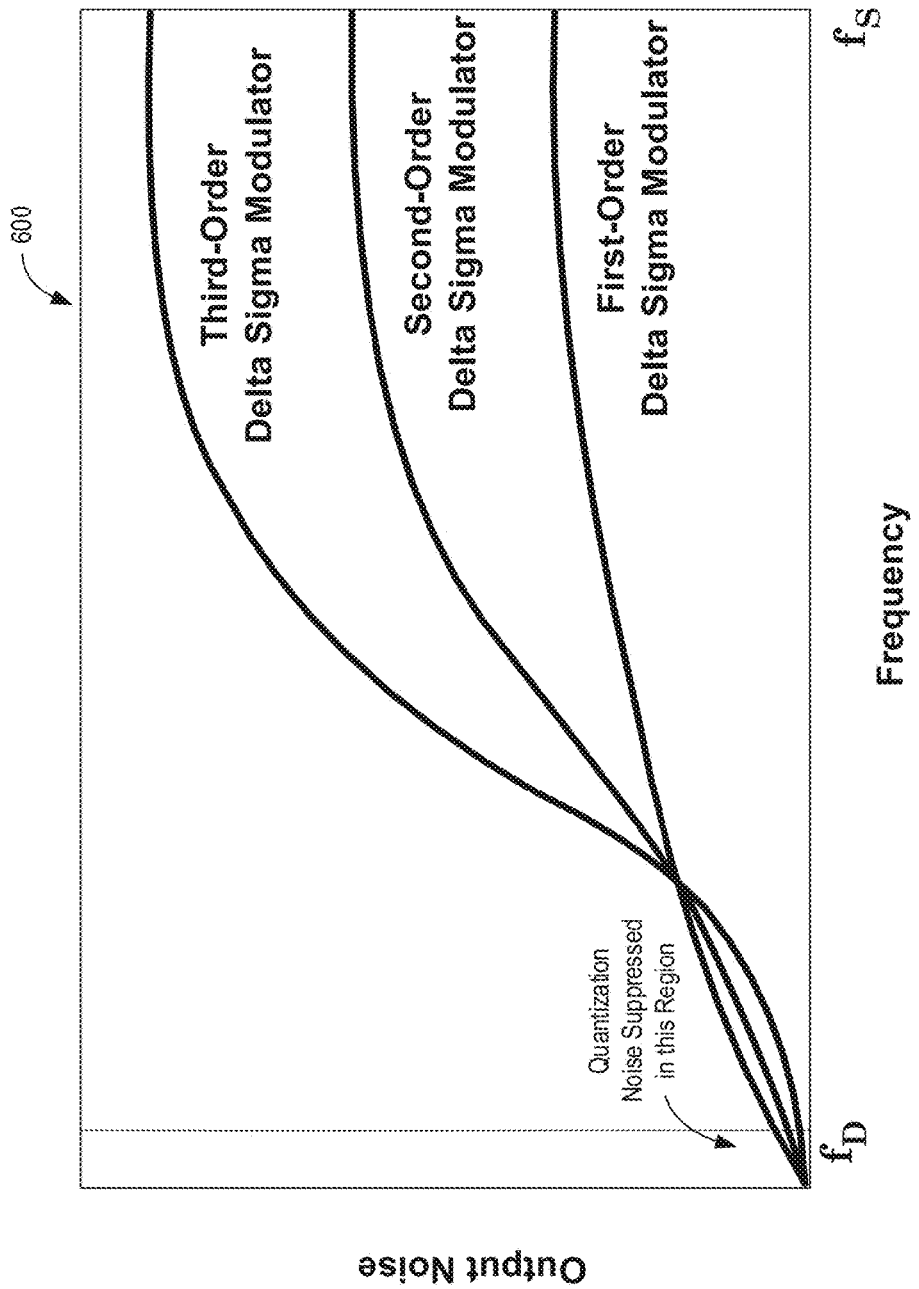
FIG. 6 illustrates noise-shaping functions for first-, second-, and third-order delta-sigma modulators, according to various embodiments.

FIG. 6 illustrates noise-shaping functions 600 for first-, second-, and third-order delta-sigma modulators, according to various embodiments. The error signal e(n) is generally a nonlinear function of the input x(n); however, for sufficiently complex signals it can be assumed that: (1) the error sequence e(n) is a sample sequence of a stationary random process; (2) the error sequence e(n) is uncorrelated with the input sequence x(n); (3) random variables of the error process are uncorrelated (i.e., the error can be modeled as a white-noise process); and (4) the probability distribution of the error process is uniform over the range of the quantization error.

It is appreciated that the presently described systems and methods can also be employed (with minor adaptation in some instances) in systems in which the quantization noise does not conform to the assumptions above (e.g., the probability distribution of the errors process is not uniform over the range of the quantization error and/or the error sequence e(n) is correlated with the input sequence x(n)).

It is analytically demonstrable that for a sufficiently random input, the error signal of a noise-shaping modulator has a white spectrum. However, for nonrandom inputs (e.g., a sinusoidal input signal), the quantization noise may be dependent on the input signal. Time-domain simulation may be used to produce more precise results than assuming a white spectrum for the noise.

Quantization noise in noise-shaping modulators, such as delta-sigma modulators, can produce correlated noise (tones) that appear in one or more frequency bands of interest. Because correlated noise can degrade converter performance, many noise-shaping modulators employ techniques to shape the error signal as much like white noise as possible so that it can be more easily filtered (e.g., via dithering). Many of the embodiments of the systems and methods described herein assume the error signal approximates white Gaussian noise. It is appreciated that the presently described systems and methods can also be employed (with minor adaptions in some instances) in systems in which the correlated quantization noise exists in the output of the ADC.

One approach for detecting a failure in an ADC is based on comparing the shape of the quantization noise with an expected NTF shape. Based on the assumption that the quantization noise spectrum is approximately flat, the following formula can be used:

$$V_{Qe,RMS} = \frac{V_{LSB}}{\sqrt{12}} \qquad \text{Equation 8}$$

In Equation 8, $V_{LSB}$ is a voltage step represented by the least significant bit of the output code and $V_{Qe,RMS}$ is the total RMS power of the quantization noise. For a delta-sigma modulator of order M, the NTF can be expressed as:

$$\text{NTF}(z)=(1-Z^{-1})^M \qquad \text{Equation 9}$$

Converting to the s-domain and computing the magnitude of the noise transfer function gives:

$$|NTF(s)| = \left[2\sin\left(\frac{\pi f}{f_s}\right)\right]^M \qquad \text{Equation 10}$$

A power spectral density (PSD) of the modulation noise can be determined by applying the white-noise model across all frequencies using the identity in Equation 8, and then shaping the resulting flat spectrum per the NTF in Equation 10. The PSD is expressible as:

$$PSD_{noise} = \frac{V_{LSB}^2}{12f_s}\left[2\sin\left(\frac{\pi f}{f_s}\right)\right]^{2M} \qquad \text{Equation 11}$$

Equation 11 provides the PSD in $V^2$/Hz. An RMS noise value over a particular bandwidth can be calculated by integrating with respect to frequency, f. For the first-order modulators, M is equal to 1 and the resultant integral is relatively simple compared to second- and third-order modulators.

Figure 7:
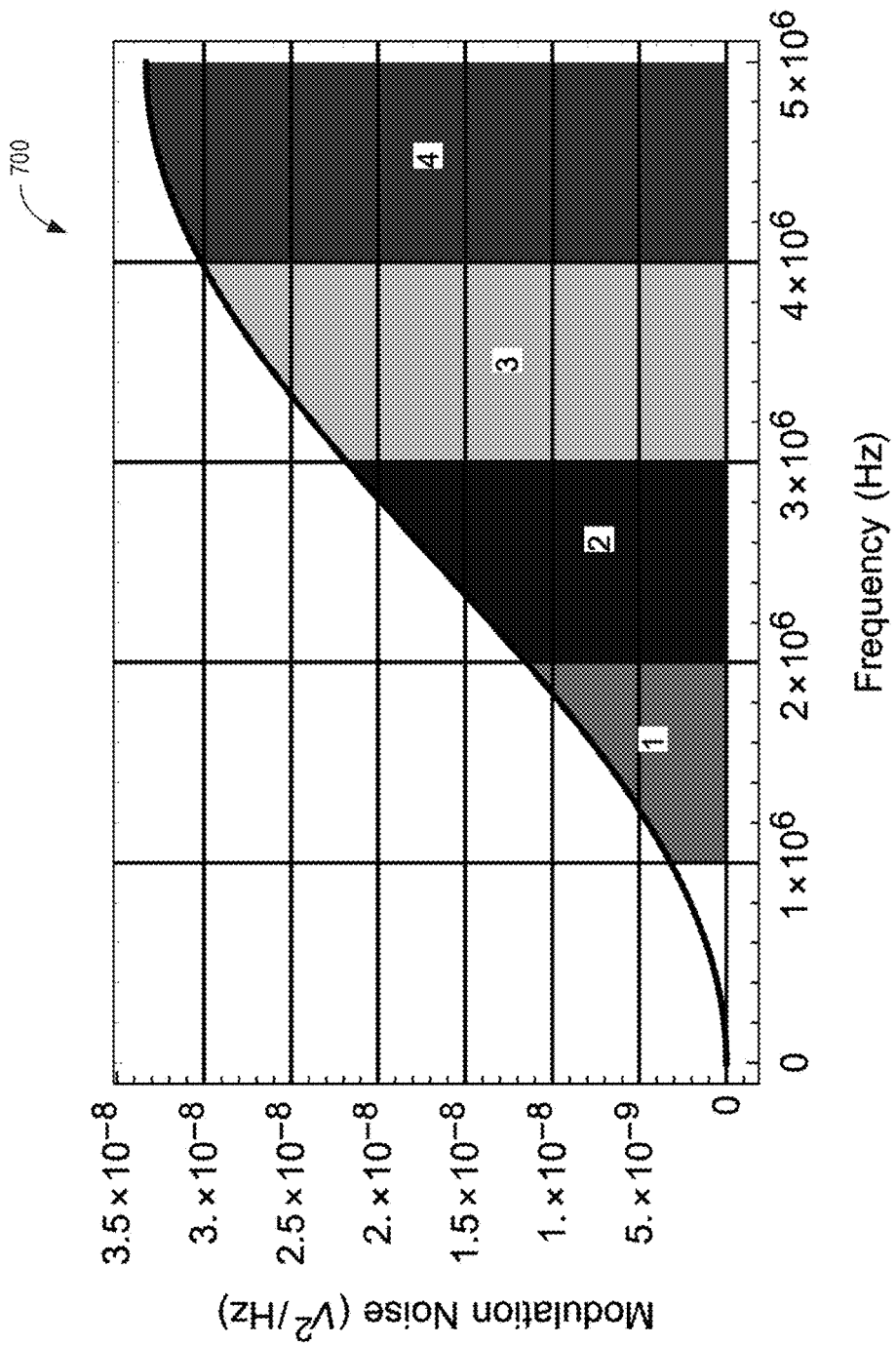
FIG. 7 illustrates modulation noise from a first-order modulator relative to frequency, according to one embodiment.

FIG. 7 illustrates modulation noise 700 from a first-order modulator relative to frequency, per the embodiments described above. The illustrated embodiment corresponds to a modulator with a sampling frequency of 10 MHz. The square root of the area under the curve is equal to the RMS noise over a bandwidth of interest. FIG. 7 includes 4 bandwidths of interest, labeled with 1, 2, 3, and 4.

Figure 8:
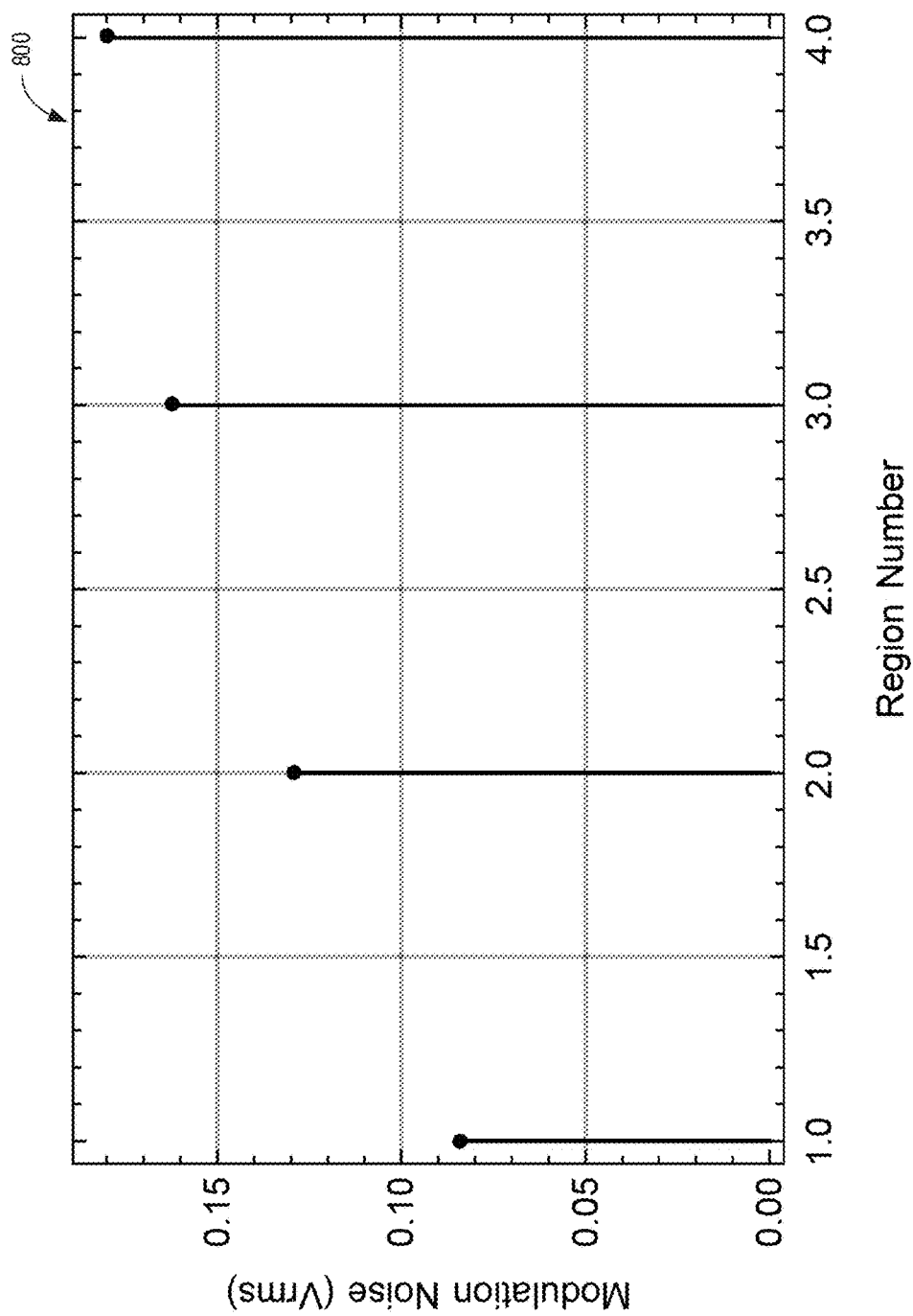
FIG. 8 illustrates the root mean square (RMS) noise of each identified area in FIG. 7.

FIG. 8 illustrates the root mean square (RMS) noise 800 of each identified area in FIG. 7. Specifically, the noise power of region 1 is approximately 0.085 $V_{RMS}$, the noise power of region 2 is approximately 0.13 $V_{RMS}$, the noise power of region 3 is approximately 0.16 $V_{RMS}$, and the noise power of region 4 is approximately 0.18 $V_{RMS}$.

As illustrated above, low pass noise-shaping ADCs, by design, should have larger RMS noise levels in bandwidths of higher frequencies. According to various embodiments, an ADC monitoring device may include multiple bandpass filters on the output of the modular. Each of the bandpass filters may focus on a particular frequency region. The RMS values of each filter output can be computed and comparators can be used to ensure that bandwidths of higher frequencies have higher RMS values than bandwidths of lower frequencies. The ADC monitoring device may detect an ADC anomaly or failure based on a determination that an RMS value of a first, lower frequency bandwidth (first frequency band) is higher than a second, higher frequency bandwidth (second frequency band). That is, the first frequency band includes frequencies that are lower than those included in the second frequency band. In some embodiments, the first frequency band and the second frequency band may overlap.

Figure 9:
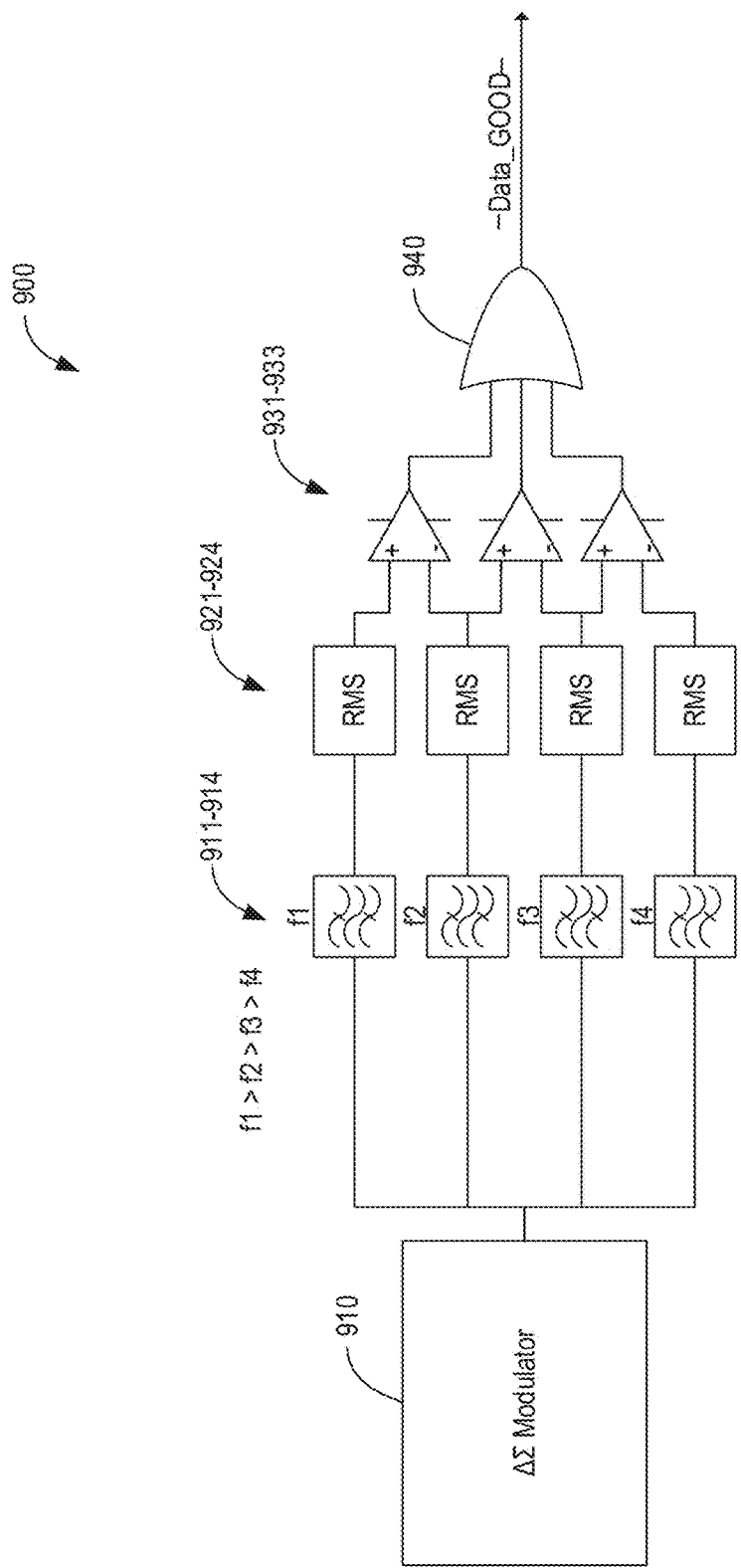
FIG. 9 illustrates an example of a circuit to detect an incorrect shape in modulation noise.

FIG. 9 illustrates an example of a circuit 900 to detect an incorrect shape in modulation noise. The output of a delta-sigma ADC 910 is fed into four bandpass filters 911-914, labeled f1, f2, f3, and f4. f1 represents a first frequency band that contains higher frequencies than a second frequency band, f2, which contains higher frequencies than a third frequency band, f3, which contains higher frequencies than a fourth frequency band, f4. An RMS value 921-924 is calculated for each of the frequency bands. Comparators 931-933 are used to determine if the RMS value 921-924 of each higher band is greater than the RMS value 921-924 of each lower band.

In some embodiments, the output of the delta-sigma ADC 910 may be fed into the four bandpass filters 911-914 before a decimation filter of the ADC. In other embodiments, the output of the delta-sigma ADC 910 may be fed into the four bandpass filters 911-914 after the decimation filter.

The illustrated embodiment includes four bandpass filters 911-914, but any number of bandpass filters (2 or more) may be compared. Moreover, the illustrated embodiment includes logic 940 such that a good signal is determined as long as higher bands (e.g., f1) have higher RMS values than immediately lower bands (e.g., f2). In some embodiments, a failure of any higher band to have a higher RMS value than an RMS value of one or more lower bands may result in a failure determination. Thus, the logic embodied in comparators 931-933 and gate 940 ensures that if these noise shape characteristics (e.g., the RMS value for higher frequency band should exceed the RMS values of lower frequency bands) are not met, then ADC verification fails.

While many of the embodiments described herein utilize bandpass filters as a method for isolating a particular frequency band of interest, it is appreciated that a wide variety of filter architectures may be used. For example, it is appreciated that lowpass (LPF) filters and/or highpass (HPF) filters of various constructions, topologies, and architectures may alternatively be used. For example, in the case of a lowpass delta-sigma modulator, wherein the quantization noise is expected to reside in a high frequency band, a first lowpass filter with a cutoff frequency f1 may be instantiated. A second lowpass filter with cutoff frequency f2, where f2 is greater than f1 may also be instantiated. An RMS value of the first lowpass filter may be compared with an RMS value of the second lowpass filter. Logic may then ensure that if the noise shape characteristics (e.g., the RMS value for the second lowpass filter should exceed the RMS value of the first lowpass filter) are not met, then ADC verification fails.

In still other embodiments, Fourier transforms (e.g., FFTs) may be calculated. For instance, hardware-based FFTs may be computed using methods specific to one-bit signals. A wide variety of bandwidths can be selected for comparison. In the example in FIG. 7, 1 MHz bandwidths are used and the white noise assumptions and approximations are particularly valid. The exact equation for the quantization noise spectrum for a particular ADC or ADC family may show that there are individual spikes in noise, but it still follows the noise shape derived by the white-noise model. Thus, the RMS bandwidth may be wide enough to capture multiple "spikes" of quantization noise.

Thus, in various embodiments, an error checking system for a noise-shaping ADC can indicate an ADC error based on a determination that an RMS value of one frequency band is less than an RMS value of another. A first power module may calculate a first RMS value of quantization noise output by a noise-shaping modulator within a first frequency band. A second power module may calculate a second RMS value of quantization noise output by the noise-shaping modulator within a second frequency band. A comparison subsystem may compare the first RMS value with the second RMS value and an error identification subsystem may indicate an ADC error based on a determination that the first RMS value is less than the second RMS value. As previously noted, the noise-shaping modulator may be part of a noise-shaping ADC, such as a delta-sigma modulator.

More complex and/or accurate error checking may be accomplished by calculating RMS values of third, fourth, fifth, etc. frequency bands. Indicating an error may be accomplished by transmitting an error signal or ceasing to transmit a verification signal. Power modules to calculate RMS values of frequency bands may include bandpass filters and/or integrators. Similar embodiments and adaptations thereof may be utilized for one-bit noise-shaping modulators and multi-bit noise-shaping modulators alike. Moreover, first-order, second-order, third-order, etc. noise shaping modulators may also be used.

While many of the embodiments described herein relate to comparisons of an RMS value with thresholds and/or a comparison of RMS values associated with various frequency bands, it is appreciated that a wide variety of quantization noise "shape" evaluation approaches may be utilized. For example, while power modules may be used to calculate RMS values, it is appreciated that a wide variety of alternative quantization noise evaluation modules may be employed to calculate RMS values, magnitudes, frequency domain spectrums, and/or other identifiable characteristics of one or more frequency bands.

Thus, in various embodiments, a first quantization noise evaluation module may identify a quantization noise characteristic (e.g., a magnitude, RMS value, frequency domain spectrum, etc.) of an output of one or more frequency bands of a noise-shaping modulator. The identified quantization noise characteristic may be compared with threshold values (e.g., minimum and/or maximum values) and/or may be compared with corresponding quantization noise characteristics identified for other frequency bands of the output of the noise-shaping modulator.

An ADC error may be determined if the quantization noise characteristic is outside of a threshold range. Similarly, an ADC error may be determined if the quantization noise characteristic associated with a first frequency band is outside of a threshold associated with a quantization noise characteristic associated with a second frequency band. For instance, an ADC error may be determined if a magnitude or RMS value of a first frequency band is smaller than a magnitude or RMS value of a second frequency band.

While many of the embodiments of the various comparison subsystems and error identification subsystems (e.g., modules) are described and illustrated using block diagrams and discrete components, it is appreciated that they may be embodied as one or more differential amplifiers, logic gates, software modules, ASICs, and FPGAs.

Figure 10:
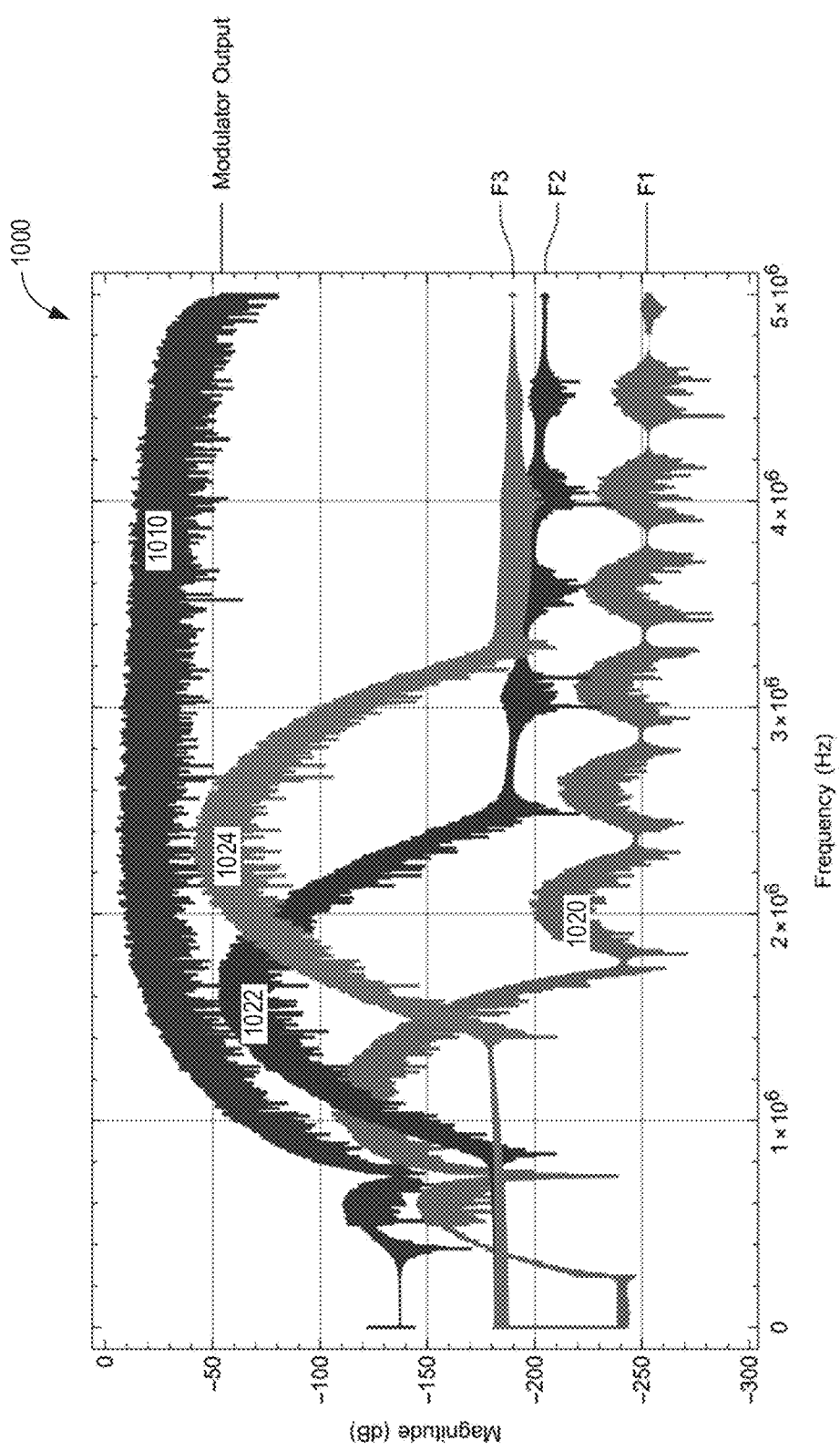
FIG. 10 illustrates an output of a delta-sigma modulator filtered by three different bandpass filters with different center frequencies, according to various embodiments.

FIG. 10 illustrates an output 1010 of a delta-sigma ADC filtered by three different bandpass filters 1020, 1022, and 1024 with different center frequencies, according to various embodiments. The illustrated embodiment is a simulated embodiment of a first order modulator switching at 10 MHz based on a 60 Hz sine wave input. The output of the modulator is low-pass filtered to remove the input signal and its FFT is shown in plot 1010.

Figure 11:
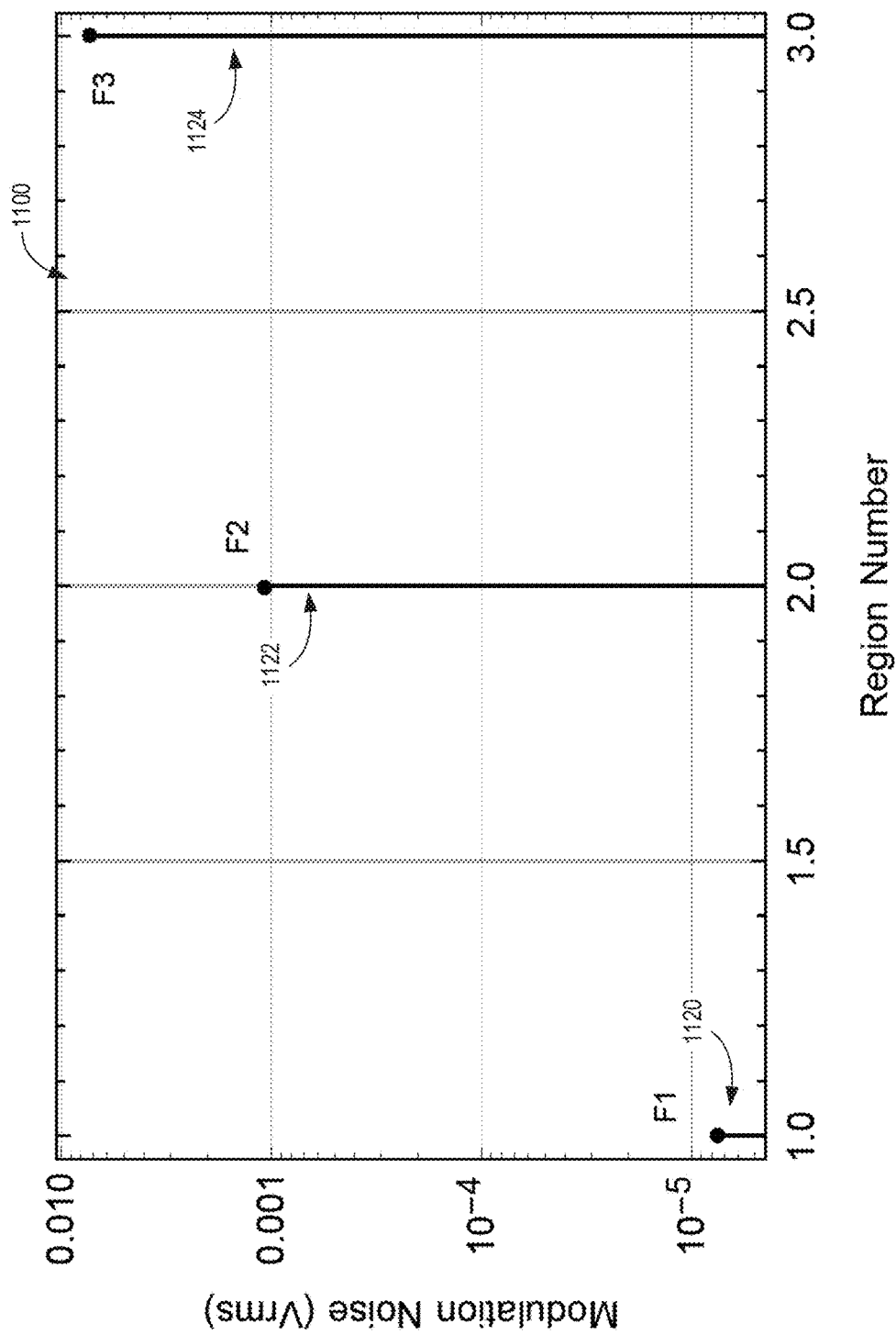
FIG. 11 illustrates the RMS voltage noise for each of the bandpass data streams shown in FIG. 10.

FIG. 11 illustrates the RMS noise 1100 for each of the bandpass data streams shown in FIG. 10. The bandpass filter with the lowest center frequency 1020 has the lowest RMS value 1120. The bandpass filter with the middle center frequency 1022 has the middle RMS value 1122. The bandpass filter with the highest center frequency 1024 has the highest RMS value 1124. As previously discussed, this pattern of values corresponds to a functional and "healthy" ADC in which the RMS values of the noise increase with frequency.

FIGS. 10 and 11 compare the relative magnitudes of specific points or regions on the quantization noise curve to each other. Deviations from expected values and/or patterns may be indicative of an ADC failure or another problem. Thresholds for deviation may be established and a controller may compare expected values and/or patterns to the established thresholds to verify the functionality of the ADC. Moreover, thresholds for deviation may be established dynamically based on one or more conditions (e.g., an input signal magnitude, input signal frequency, and/or environmental factors such as temperature and/or humidity, etc.).

In some embodiments, minimum and maximum bounds for the high-frequency portion of the modulator output may be computed. As previously noted, the output of an ADC may include an undistorted version of the input signal along with the quantization noise as shaped by the NTF. In some instances, the input signal may include high-frequency noise. This noise can be calculated and combined with an input-referred noise metric stated by the ADC manufacturer. In other instances, a lowpass filter at an input of the ADC may be designed to ensure that high-frequency noise contained in an input signal does not interfere with the ADC verification techniques described herein.

Figure 12:
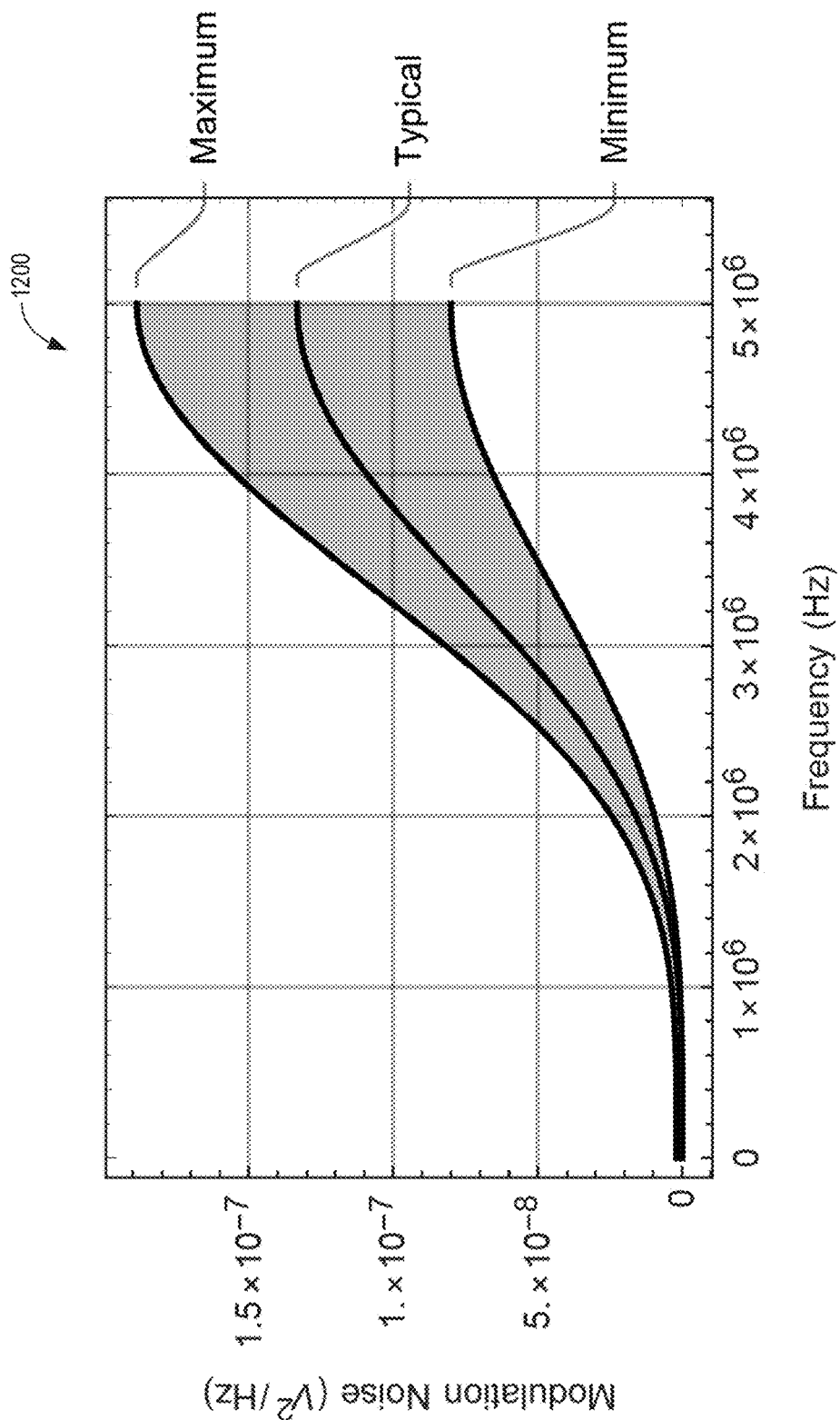
FIG. 12 illustrates a graph of minimum, typical, and maximum modulation noise with respect to frequency, according to one embodiment.

FIG. 12 illustrates a graph 1200 of minimum, typical, and maximum modulation noise with respect to frequency. One approach for verifying the health of an ADC is to compare quantization noise with calculated minimum and maximum ranges. In such an embodiment, instead of comparing RMS values of frequency bands to each other, the RMS values can be compared directly to a fixed minimum and/or maximum values. Moreover, minimum and/or maximum values may be established dynamically based on one or more conditions (e.g., an input signal magnitude, input signal frequency, and/or environmental factors such as temperature and/or humidity, etc.).

In some embodiments, an RMS value may be compared with a minimum threshold to determine if the noise levels fall below a minimum threshold value. In other embodiments, an RMS value may be compared with a maximum threshold to determine if the noise levels exceed a maximum threshold value. In still other embodiments, an RMS value may be compared with minimum and maximum threshold values.

Figure 13:
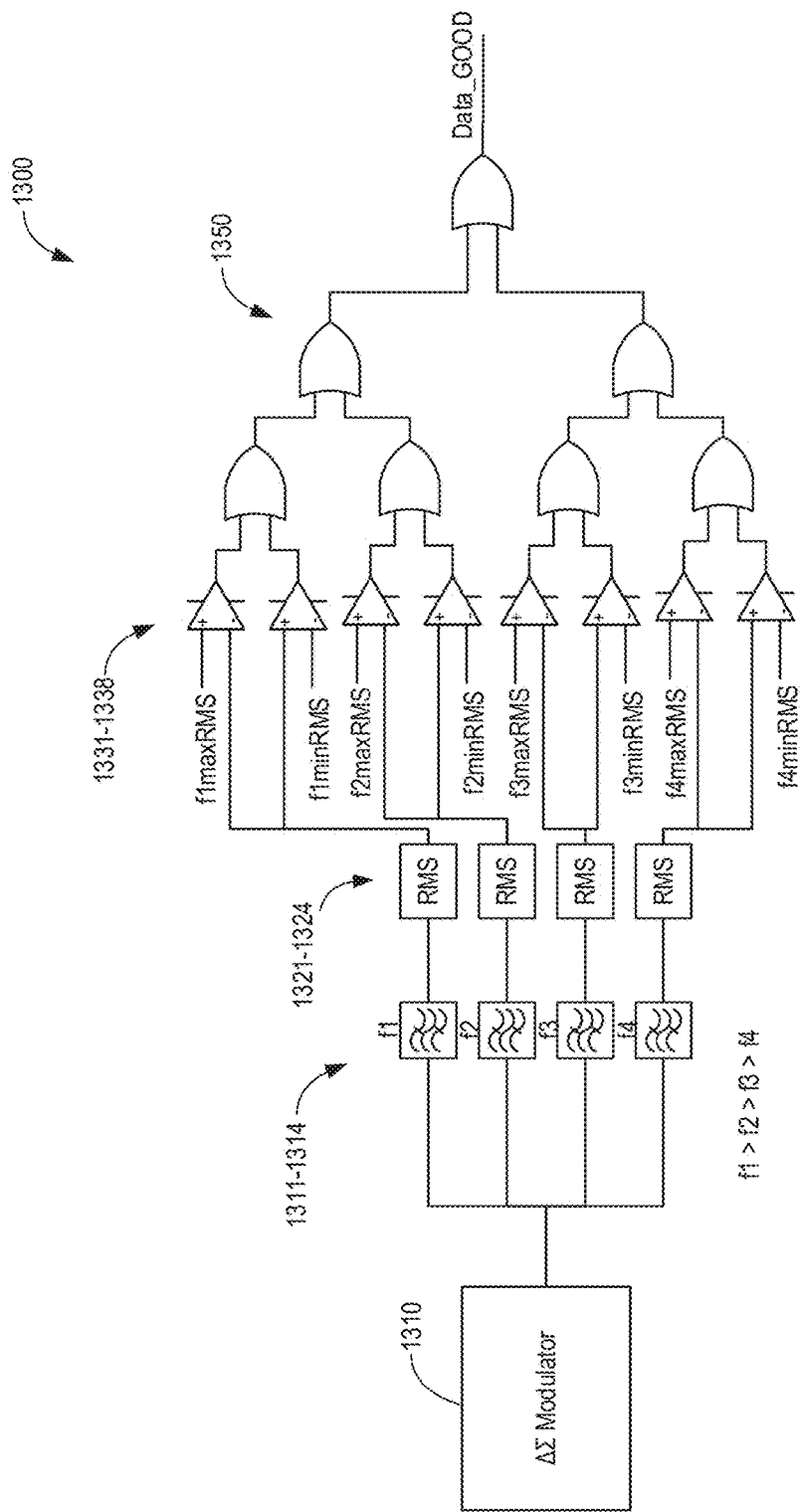
FIG. 13 illustrates an example of a circuit to detect out-of-bounds noise levels.

FIG. 13 illustrates an example of a circuit 1300 to detect out-of-bounds noise levels. As illustrated, a delta-sigma ADC modulator 1310 produces an output that is fed into a plurality of bandpass filters 1311-1314. Each of the bandpass filters 1311-1314 has a different center frequency, such that frequency band f1 is higher than frequency band f2, which is higher than f3, which is higher than the lowest frequency band f4. RMS values for each band are computed 1321-1324 and compared with maximum RMS value thresholds for each frequency band 1331-1338. Logic 1350 (e.g., OR gates) ensures that verification of the ADC 1310 is provided in the form of a "Data_Good" signal as long as the RMS values for each frequency band remain within the bounds of their respective minimum and maximum RMS values. That is, logic 1350 ensures that if these noise shape characteristics (e.g., the RMS value for each frequency should remain within minimum and maximum bounds) are not met, then ADC verification fails.

Thus, in various embodiments an error checking system for a noise-shaping ADC can indicate an ADC error by comparing one or more RMS values of one or more frequency bands with threshold values. One or more power modules may be used to calculate RMS values of quantization noise output by a noise-shaping modulator within one or more frequency bands. A comparison subsystem may compare the RMS value(s) with threshold values, including minimum and maximum RMS values (one or more of which may be set at zero/null or infinity in some embodiments).

Again, while many of the embodiments of the various comparison subsystems and error identification subsystems (e.g., modules) are described and illustrated using block diagrams and discrete components, it is appreciated that they may be embodied as one or more differential amplifiers, logic gates, software modules, ASICs, and FPGAs.

Figure 14:
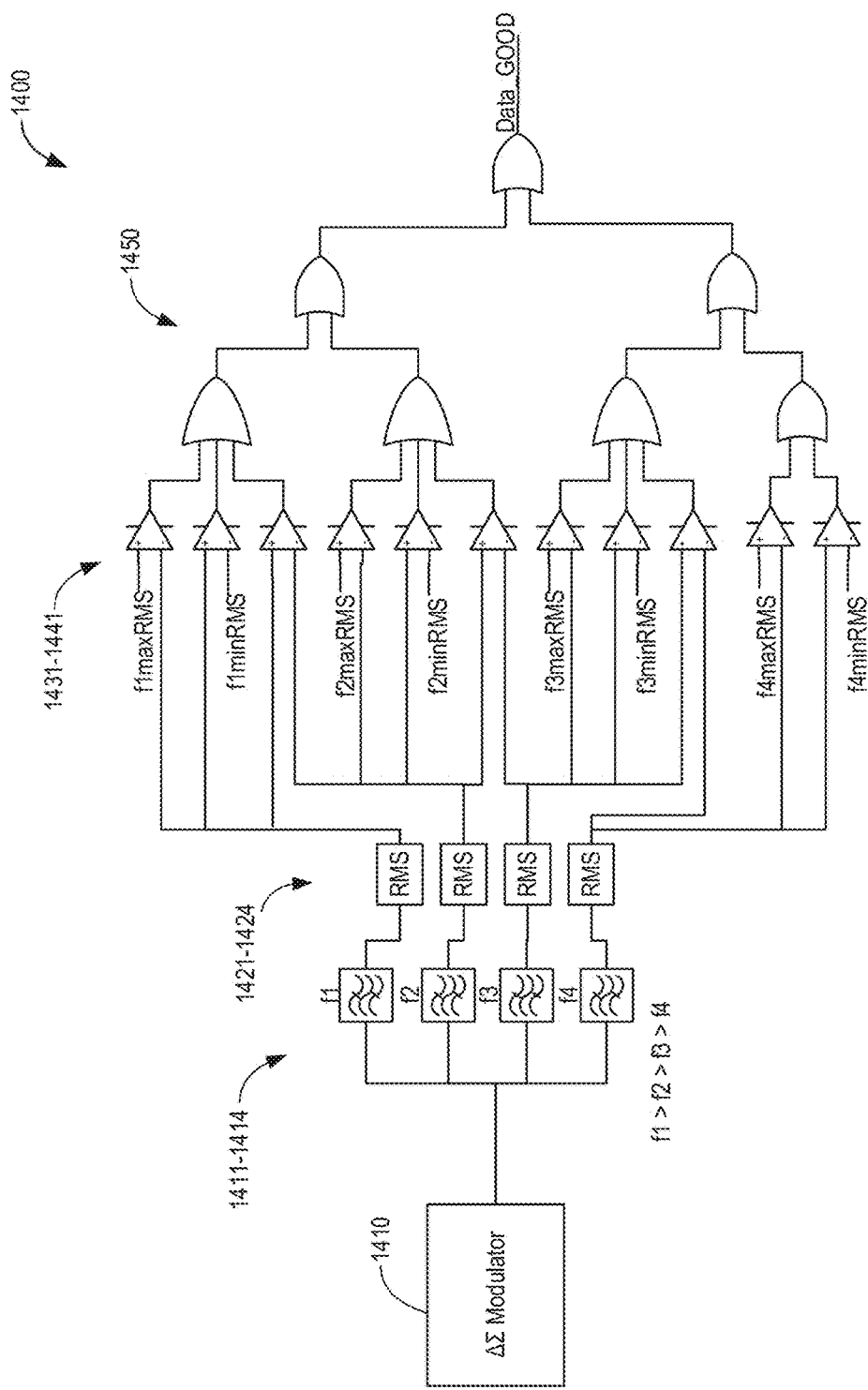
FIG. 14 illustrates an example of a circuit to detect out-of-bounds noise levels and/or incorrectly shaped noise.

FIG. 14 illustrates an example of a circuit 1400 to detect out-of-bounds noise levels and/or incorrectly shaped noise. As in previous examples, an output of a delta-sigma ADC 1410 is fed into four different bandpass filters 1411-1414 with different center frequencies. As previously noted, the number of frequency bands for calculation can be fewer or more than four. For example, a simple test may include only two bands—a high frequency band and a low frequency band. More complex verification may include any number of frequency bands. Depending on expected noise spikes for a particular input signal and/or ADC converter, bands of a particular width (e.g., 1 MHz) may help average spikes into calculated RMS values to avoid false failure indications.

As illustrated, RMS values 1421-1424 are calculated for each band. Comparators 1431-1441 compare each RMS value 1421-1424 to verify that each RMS value is both within maximum and minimum threshold values and that each higher frequency band has a greater RMS value than the RMS value for each lower frequency band. That is, if a lower frequency RMS value is larger than a higher frequency RMS value or any RMS value is out of bounds, an ADC error is flagged.

While the examples provided above reference a one-bit lowpass delta-sigma modulator for an ADC, the systems and methods described herein can be more generally applied to any of a wide variety of noise shaping modulators for ADCs with one-bit or multi-bit quantizers and/or with different noise shaping characteristics (such as bandpass or highpass modulators).

Figure 15A:
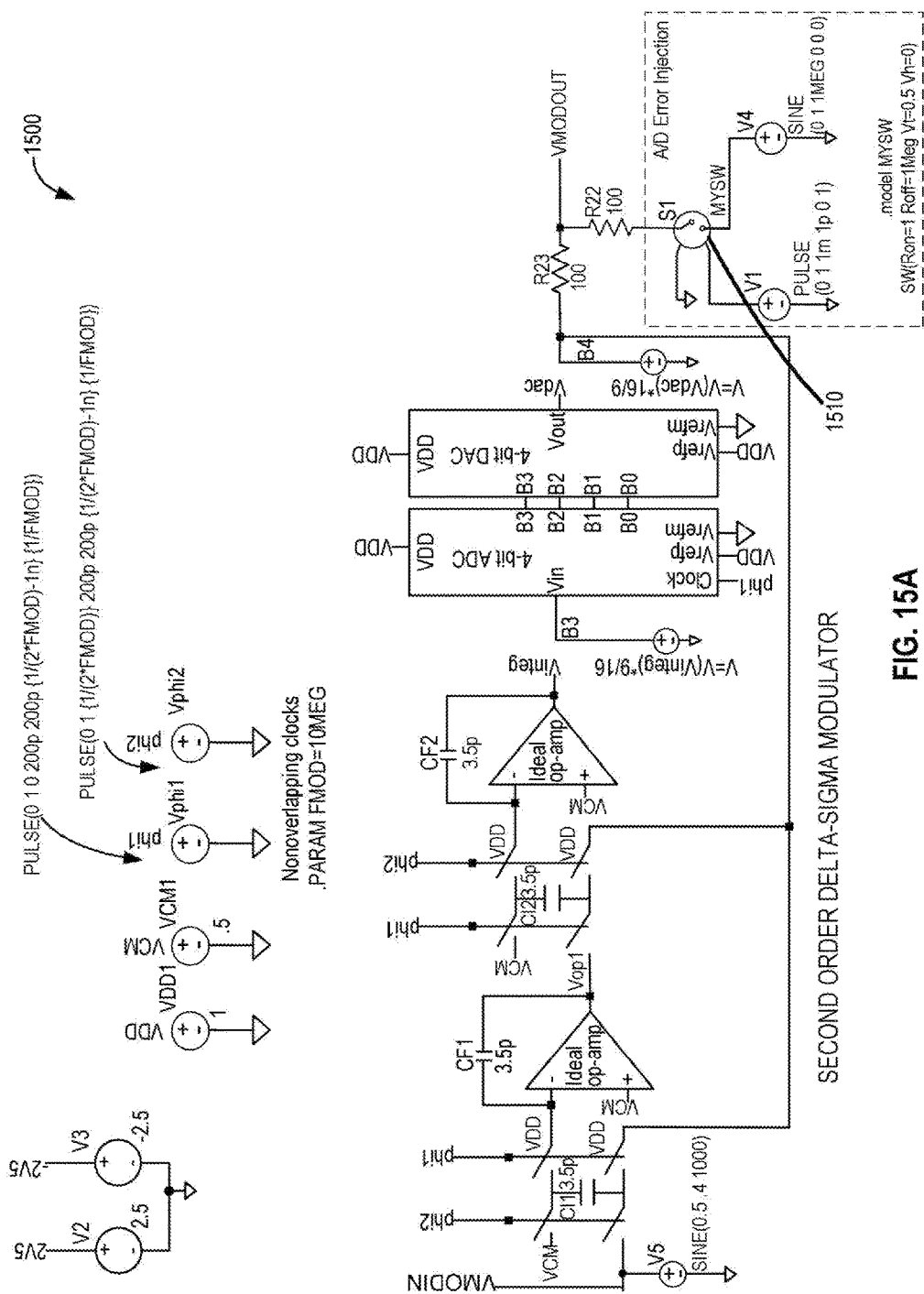
FIG. 15A illustrates a circuit diagram of one example of a second-order delta-sigma modulator.
Figure 15B:
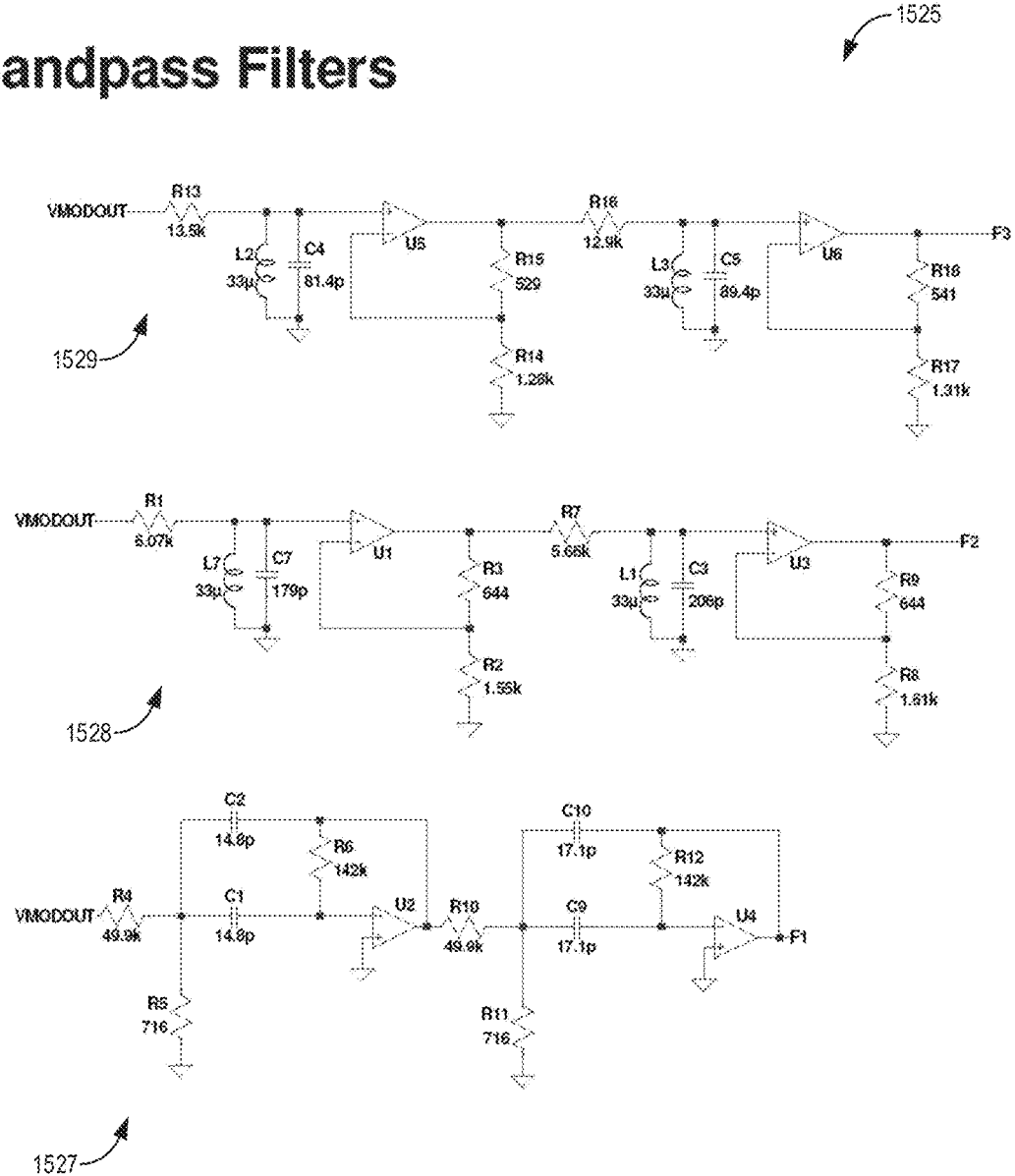
FIG. 15B illustrates a circuit diagram of one example of a bandpass filter.
Figure 15C:
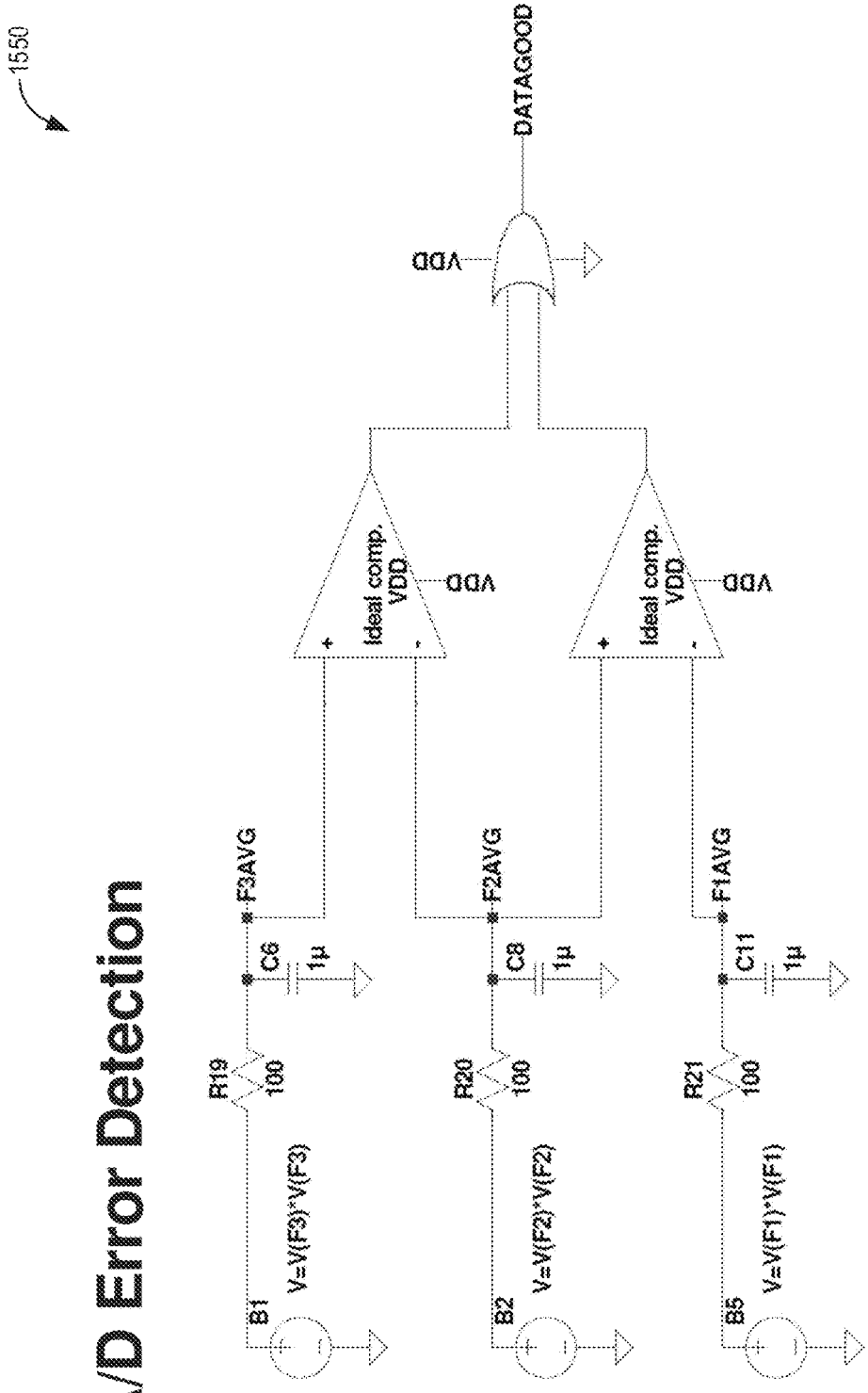
FIG. 15C illustrates an example of a circuit diagram to detect ADC errors.

FIGS. 15A-C illustrate schematic diagrams for simulating a multi-bit quantizer as part of a noise-shaping modulator of an ADC, including a second-order delta-sigma modulator 1500 in FIG. 15A, bandpass filters 1525 in FIG. 15B, and comparators 1550 for detecting the ADC errors in FIG. 15C.

The quantizer in this example is 3-bit, 9-level. The output of the modulator 1500 is connected to a switch 1510 which allows a 1 MHz noise injection to simulate an ADC error.

The output of the modulator 1500 in the schematic is connected to the three bandpass filters 1527, 1528, and 1529 shown in FIG. 15B with center frequencies at 1 MHz, 2 MHz, and 3 MHz respectively. The output of these filters is squared and then filtered to calculate a RMS value (or similar value considered an equivalent for the purposes of error checking). Finally, comparators 1550 determine whether the filtered bandpass outputs f1avg, f2avg, and f3avg are in ascending order of magnitude. If they are, the verification circuit confirms the functionality of the ADC. Otherwise, the ADC may be unverified and/or identified as defective.

Figure 16A:
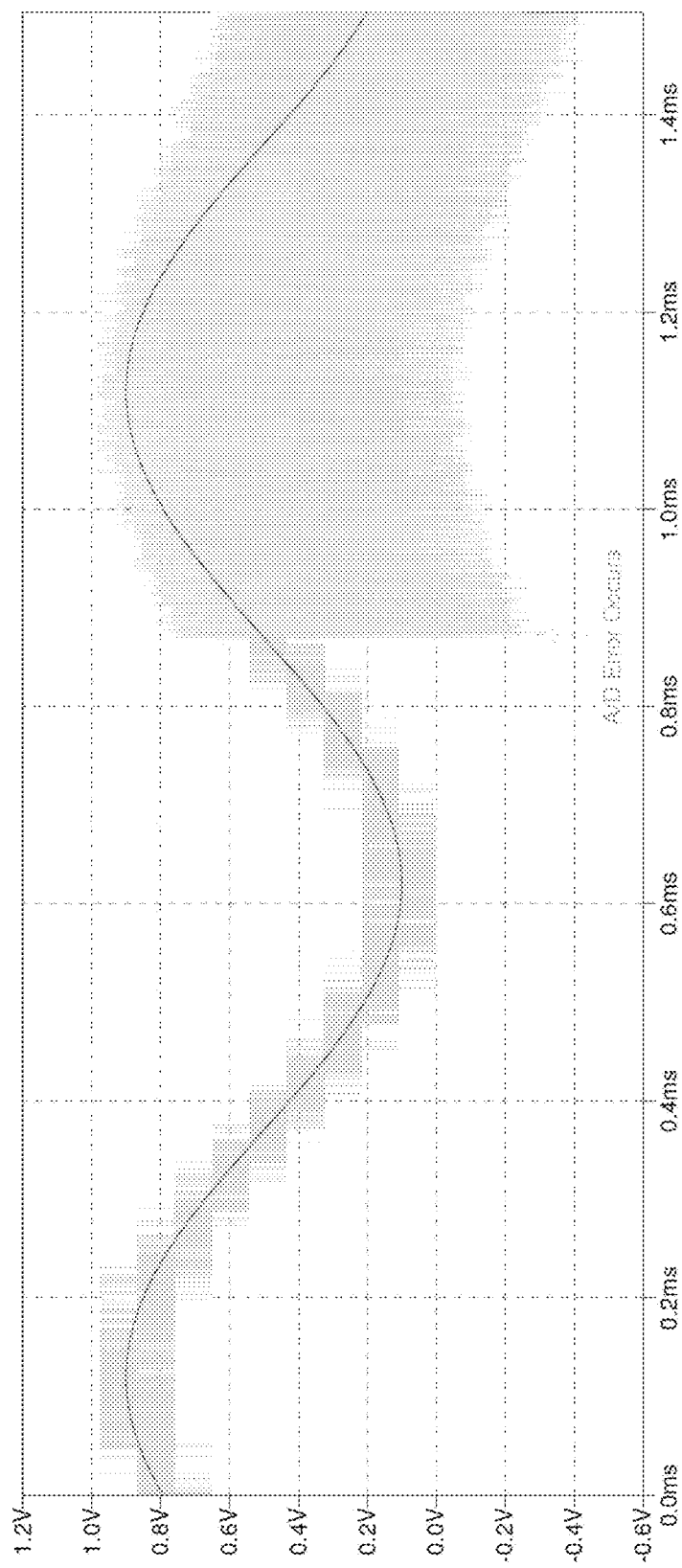
FIG. 16A illustrates high frequency noise disrupting the multi-bit modulator output at approximately 870 microseconds.
Figure 16B:
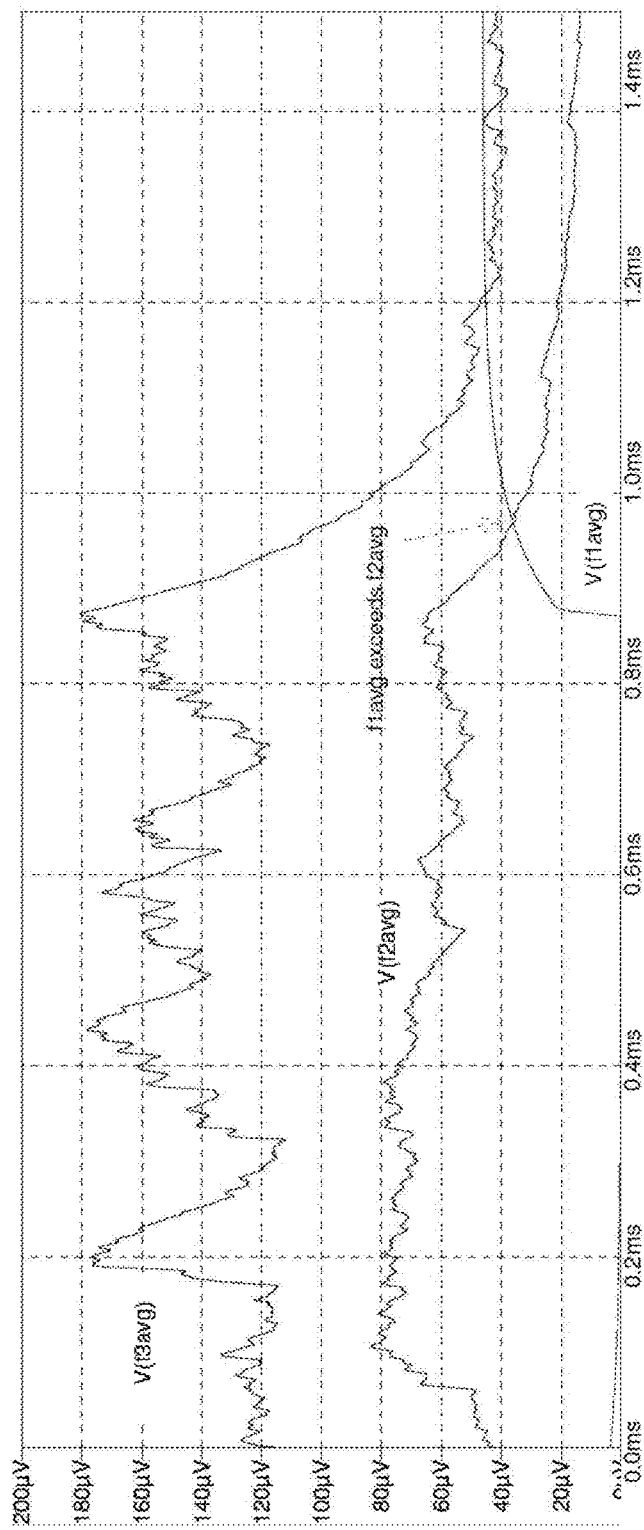
FIG. 16B illustrates voltage outputs of the circuits in FIG. 15C with the output of f1avg exceeding f2avg at approximately 970 microseconds.
Figure 16C:
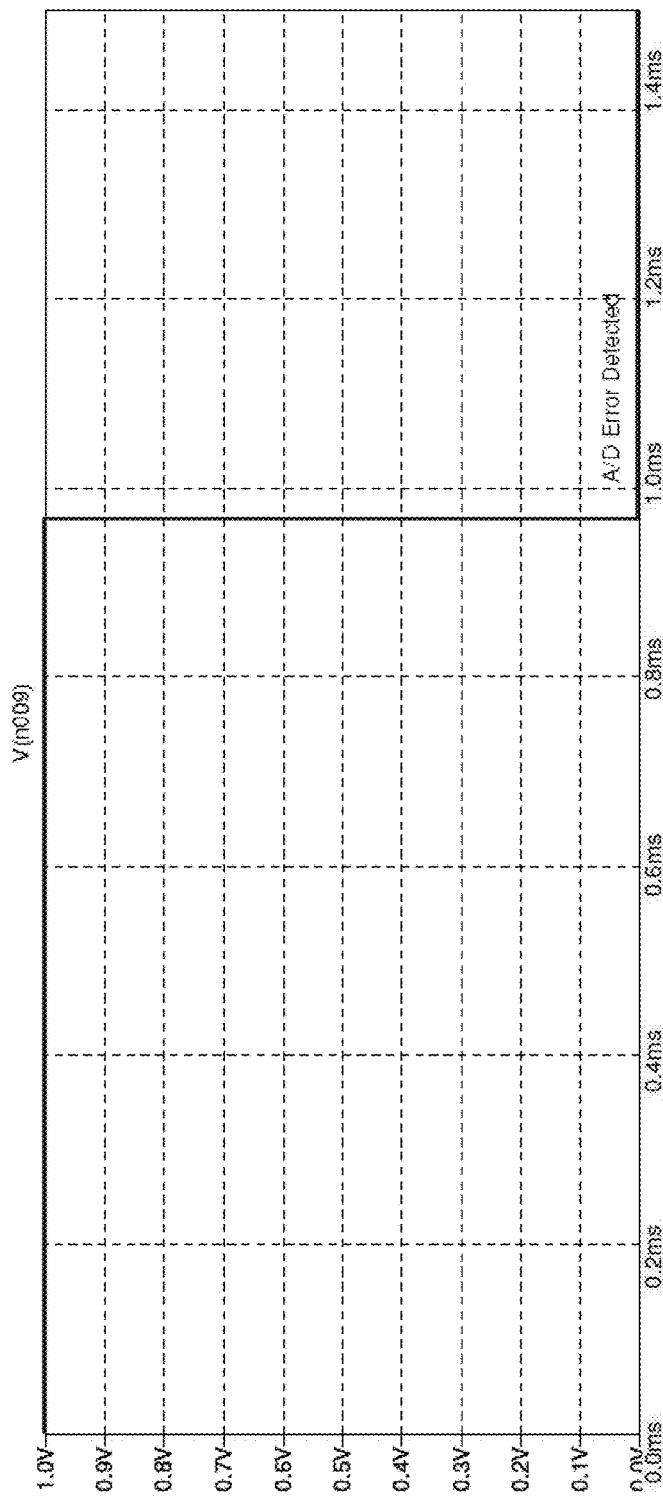
FIG. 16C illustrates an error notification of the output of the circuit in FIG. 15C in the form of an output signal transitioning to a low state at approximately 970 microseconds.

FIGS. 16A-C illustrate a simulation of the schematic diagrams in FIGS. 15A-C. FIG. 16A illustrates high-frequency noise disrupting the multi-bit modulator output at approximately 870 microseconds. FIG. 16B illustrates RMS voltage value of the circuits in FIG. 15B with the output of frequency band f1 exceeding that of frequency band f2 at approximately 970 microseconds. FIG. 16C illustrates an error notification in the form of an output signal (e.g., a verification output) transitioning to a low state at approximately 970 microseconds.

In the previously described embodiments, the magnitude of the noise can be compared to threshold tolerance bands and/or the shape of the noise can be confirmed to be "normal" (e.g., increasing in RMS value with frequency). In some embodiments, additional and/or alternative verification approaches may be utilized. For example, it is appreciated that quantization noise levels may depend on other factors such as, for example, the magnitude of the input signal, frequency of the input signal, and/or environmental factors such as temperature and/or humidity, etc.

FIG. 17 illustrates a measured shape of modulator noise versus input magnitude, according to one embodiment. As shown, the modulation noise increases with increasing input signal magnitude. Acceptance criteria of quantization noise characteristics for verification can be based on the detected magnitude of the input signal. For example, the input magnitude to quantization noise ratio relationship can be calculated, the quantization noise can be measured, and the tolerance limits can be adjusted based on the input magnitude.

Figure 18:
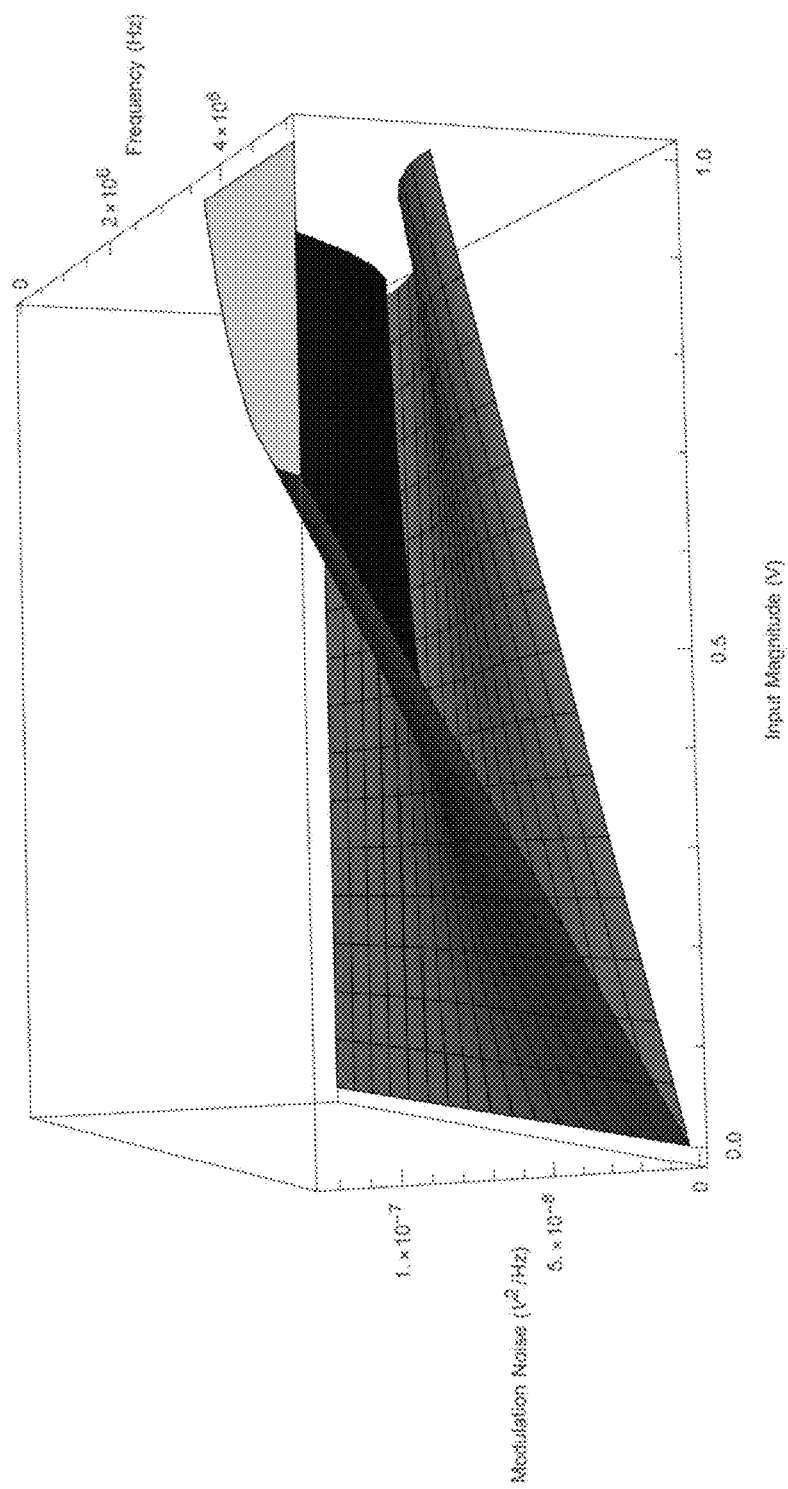
FIG. 18 illustrates maximum and minimum limits of modulation noise relative to input magnitude and frequency, according to one embodiment.

FIG. 18 illustrates maximum and minimum limits of modulation noise relative to input magnitude and frequency, according to one embodiment.

Figure 19:
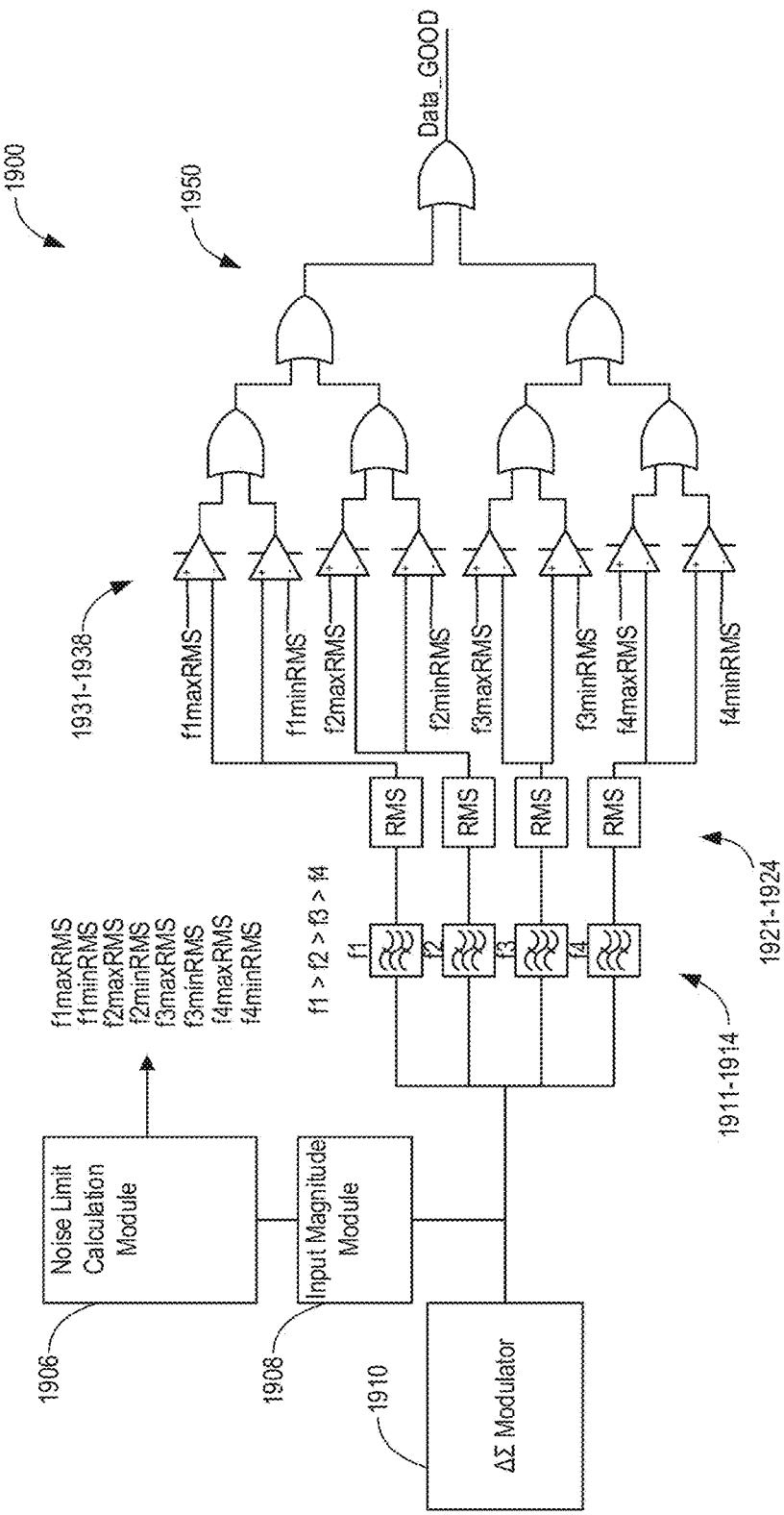
FIG. 19 illustrates an example of a circuit to detect out-of-bound noise levels.

FIG. 19 illustrates an example of a circuit 1900 to verify an ADC based on quantization noise level and input magnitude. The circuit is similar to the previous examples except for the addition of an input magnitude module 1908 and noise limit calculation module 1906 to set the RMS minimum and maximum threshold values. The input magnitude module 1908 measures the magnitude of the input signal. The noise limit calculation module 1906 then calculates the expected range of RMS noise levels for each of the four frequency bands 1911-1914 which are being monitored after respective RMS values are calculated 1921-1924 by comparators 1931-1938.

Logic 1950 ensures that if any RMS values are out of bounds, as determined by the noise limit calculation module, the ADC will be unverified and/or identified as in error. In various embodiments, the RMS minimum and maximum threshold values for each frequency band are constantly being updated based on the input signal magnitude (which can be measured before the delta-sigma modulator 1910 or, as illustrated, at the output of the delta-sigma modulator 1910). Logic 1950 ensures that if these noise shape characteristics (e.g., the RMS value for each frequency should remain within minimum and maximum bounds) are not met, then ADC verification fails.

While the noise limit calculation module 1906 is illustrated as receiving, as an input, the output of an input magnitude module 1908, it is appreciated that the noise limit calculation module may calculate quantization noise limits additionally or alternatively based on other inputs such as, for example, the magnitude of the input signal, frequency of the input signal, and/or environmental factors such as temperature and/or humidity, etc.

Figure 20:
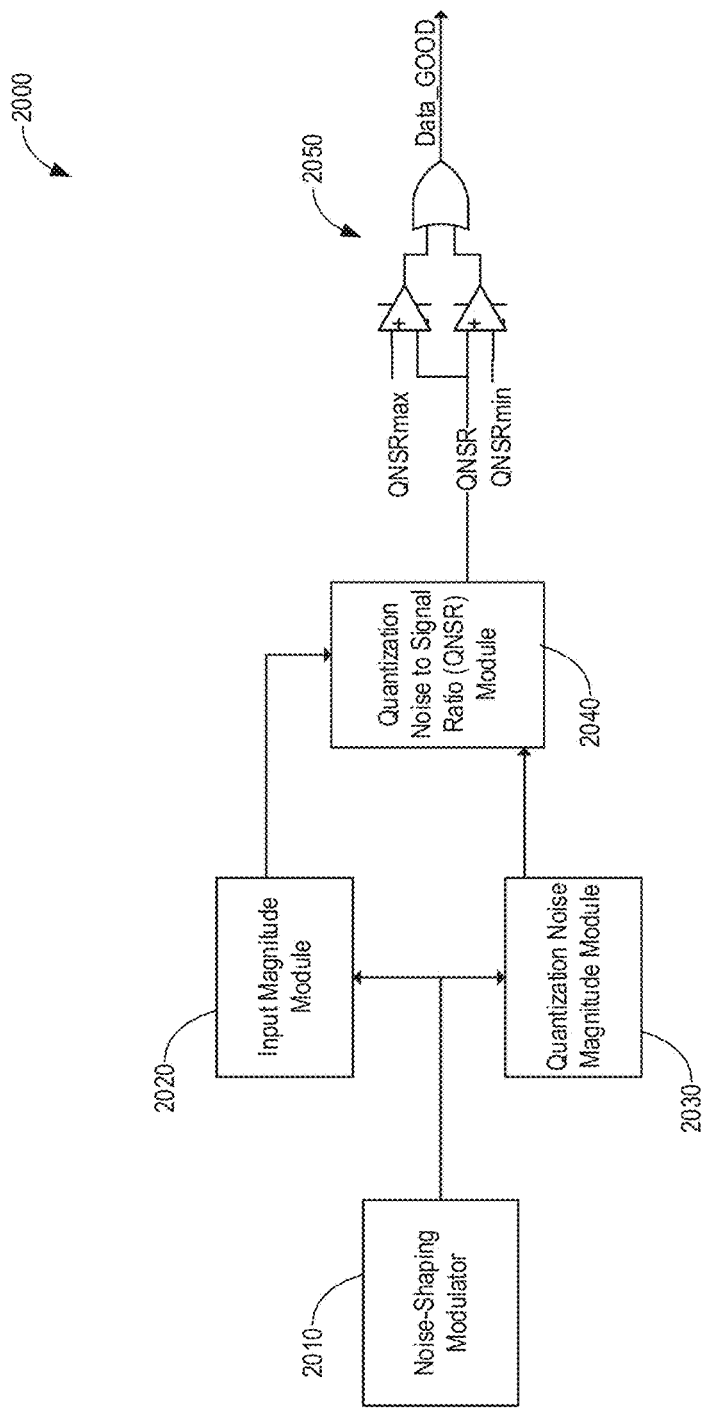
FIG. 20 illustrates a block diagram of an example of a circuit to detect ADC errors based on quantization noise-to-signal ratio.

FIG. 20 illustrates a block diagram 2000 of an example of a circuit to detect ADC errors based on quantization noise-to-signal ratio. As illustrated, the output of a noise-shaping modulator 2010 is fed into an input magnitude module 2020 and a quantization noise magnitude module 2030. The outputs of the input magnitude module 2020 and the quantization noise magnitude module 2030 are fed into a quantization noise-to-signal ratio (QNSR) module 2040. The QNSR module 2040 can compute a quantity related to the QNSR that can be evaluated against minimum and maximum thresholds or limits by comparators and logic modules 2050 to verify the functionality (e.g., health) of the noise-shaping modulator 2010 of a noise-shaping ADC.

Thus, in some embodiments an error checking system for noise-shaping ADCs may determine a magnitude of an input signal to a noise-shaping modulator and a magnitude of quantization noise produced by the noise-shaping modulator. A QNSR value may be calculated and compared to a threshold range bounded by at least one of a minimum QNSR value and a maximum QNSR value (one of which may be zero/null or infinity in some embodiments). An ADC error may be indicated if the calculated QNSR value is outside of the threshold range. As in previous embodiments, the threshold range may be based, at least in part, on the magnitude of the input.

Figure 21A:
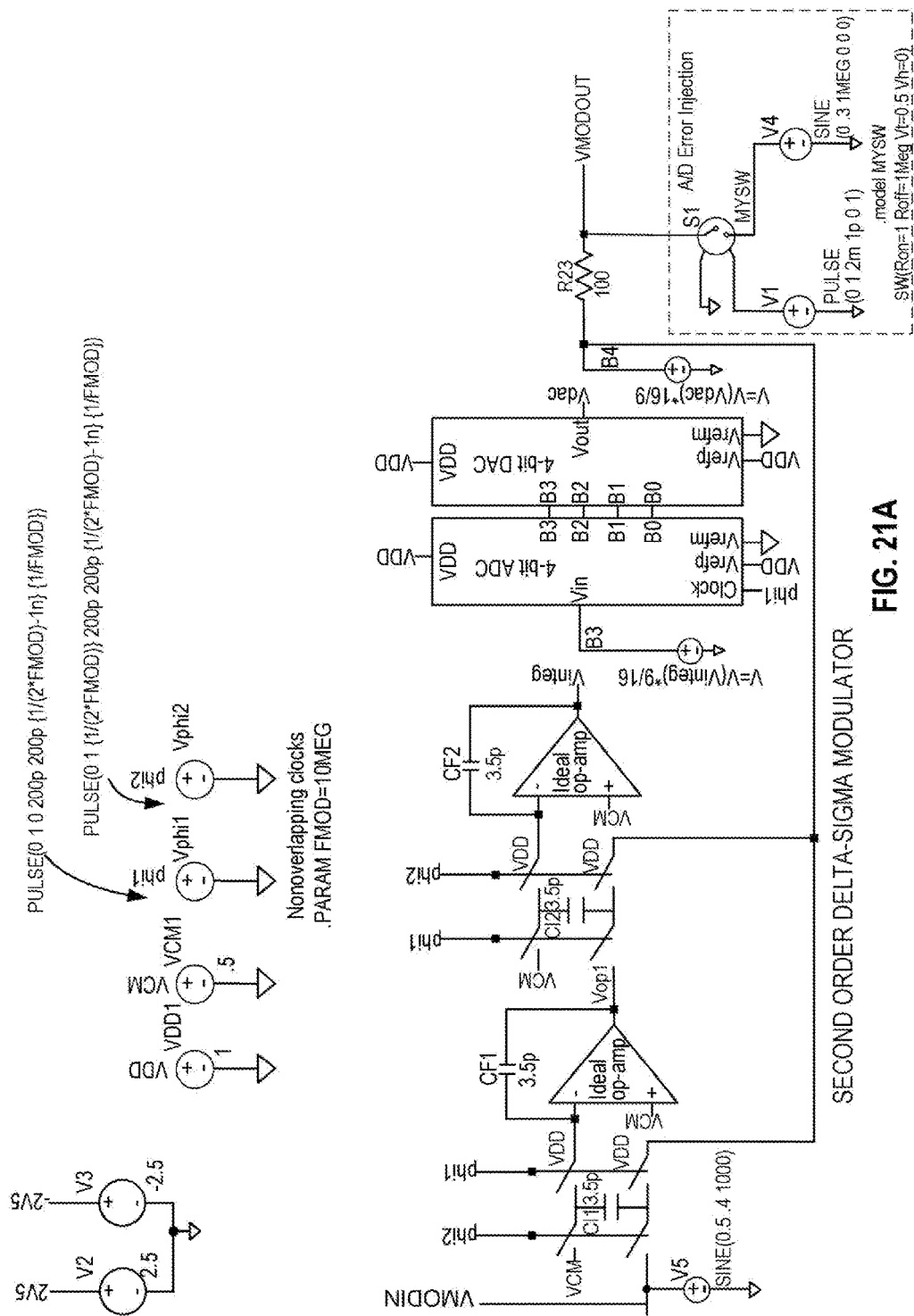
FIG. 21A illustrates an example of a second-order delta-sigma modulator.
Figure 21C:
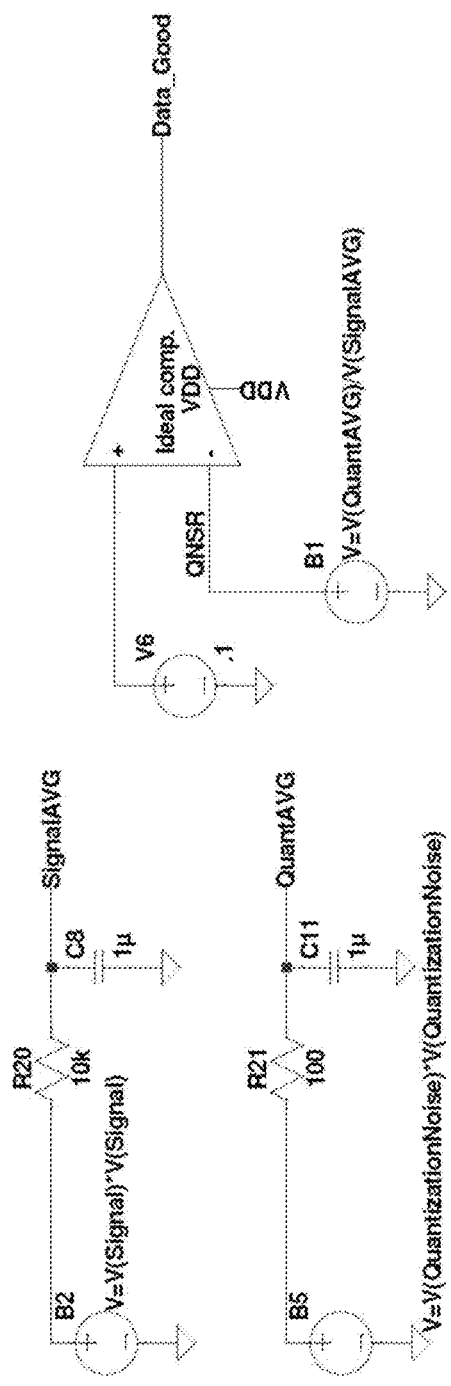
FIG. 21C illustrates an example of circuits for ADC error detection.

FIGS. 21A-C illustrate schematic diagrams of an example of a second-order delta-sigma modulator in FIG. 21A, signal and quantization noise filters in FIG. 21B, and verification logic for ADC (shown using an alternative acronym A/D) error detection in FIG. 21C.

Figure 22C:
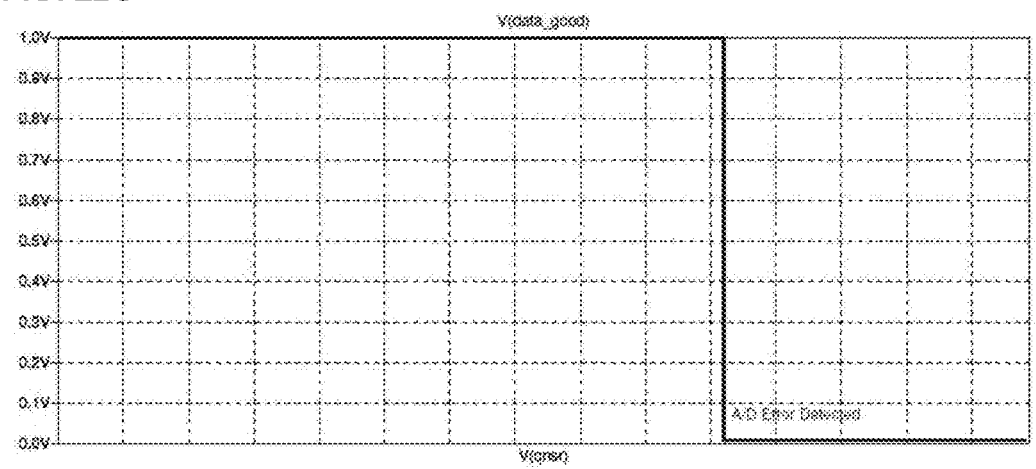
FIGS. 22A-C illustrate an output falling to a low state to indicate an error in the ADC based on a quantization noise-to-signal ratio rising in response to high frequency noise disrupting a multi-bit modulator at approximately 1 millisecond.
Figure 22B:
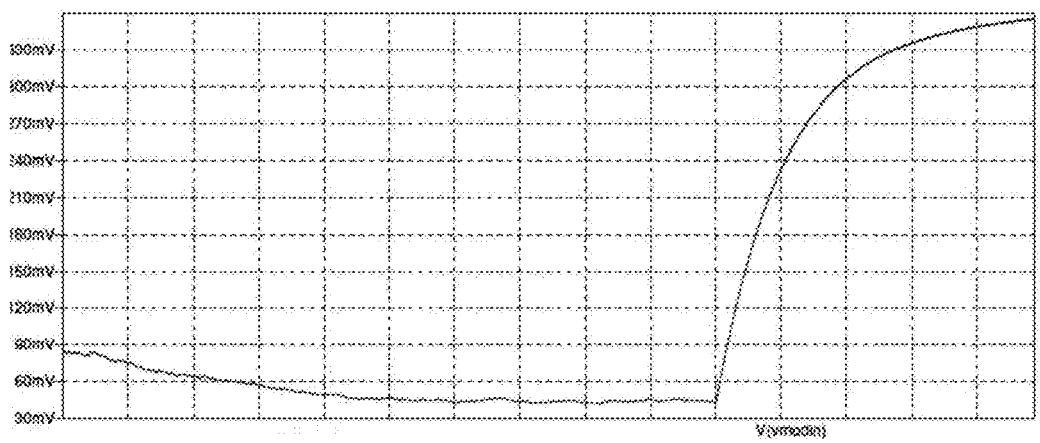
Figure 22A:
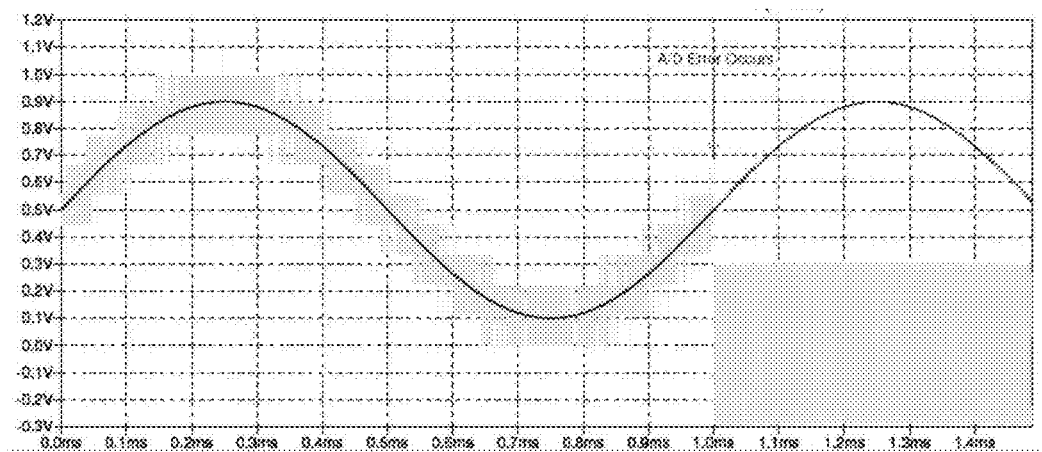

FIGS. 22A-C illustrate an output falling to a low state to indicate an error in the ADC (FIG. 22C) based on a quantization noise-to-signal ratio rising (FIG. 22B) in response to high-frequency noise disrupting a multi-bit modulator at approximately 1 millisecond (FIG. 22A).

As illustrated and described in the preceding embodiments, quantization noise of a noise-shaping ADC can be compared with expected values, shapes, and thresholds to verify the functionality of an ADC. The comparisons above are conceptually explained and illustrated in the frequency domain. However, quantization noise can also be recognized and compared against expected values, shapes, and thresholds in other domains such as, for example, the time domain, wavelet domain, z-domain, and s-domain.

For instance, in the time domain a one-bit delta-sigma modulator is expected to transition from a low to a high state (and vice versa) many times in a short period of time in order for the quantization noise to be shaped into a high-frequency band. That is, it is expected that for a sequence of length N, the output of the ADC will contain many transitions from 0 to 1 or from 1 to 0 due to the relatively high-frequency quantization noise.

Thus, an error checking system for a noise-shaping analog-to-digital converter (ADC) can evaluate an identifiable characteristic in a sequence of pulses and compare it to threshold minimum and/or maximums to detect an ADC error. For example, a pulse characteristic evaluator may determine an identifiable characteristic in a sequence of pulses output by a noise-shaping modulator. The identifiable characteristic may be, for example, a count of the number of pulses within the sequence that have a specific width or widths, an average width of the pulses within the sequence, and/or a number of transitions in the sequence of pulses (e.g., the number of transitions in a sequence of output bits).

Accordingly, a first pulse characteristic evaluator may be a pulse counter, a pulse width averaging module, a transition detection subsystem, or the like. The following examples pertain to a pulse counter configured to count the number of pulses within a sequence of pulses that have a specific width or that are within a specific width range. It is appreciated that similar embodiments and examples can be provided for other characteristic evaluation systems, such as those adapted to determine average pulse widths and/or count the number of transitions.

Figure 23A:
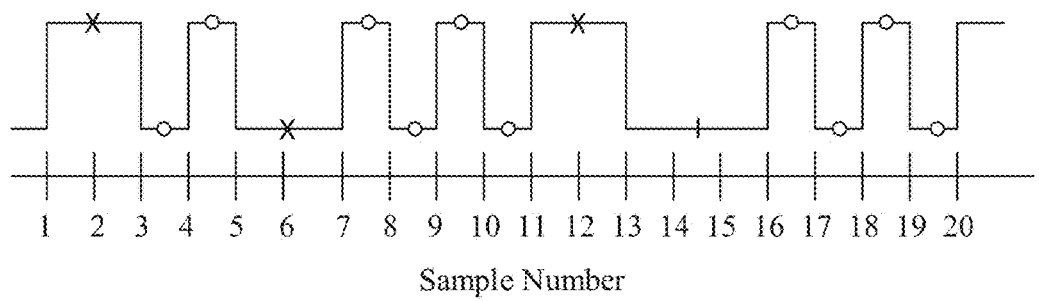
FIG. 23A illustrates a sample of delta-sigma modulator output with a plurality of pulses having various widths, according to one embodiment.

FIG. 23A illustrates a sample of length 20 from a delta-sigma modulator output. A count is shown illustrating that ten pulses have a width of one, three pulses have a width of two, and one pulse has a width of three.

Figure 23B:
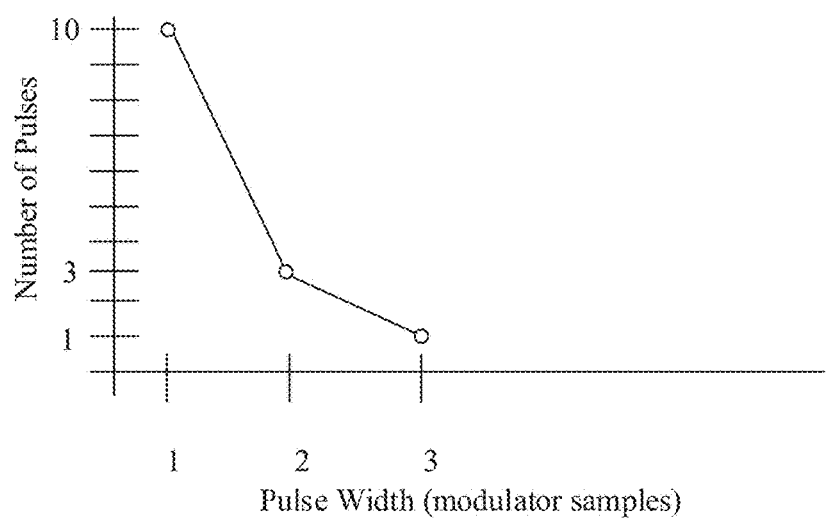
FIG. 23B illustrates a plot of the number of pulses relative to pulse width of the sample in FIG. 23A.

FIG. 23B illustrates a plot of the number of pulses relative to pulse width of the sample in FIG. 23A. As shown, a clear relationship between the pulse width and number of such pulses can exist in a delta-sigma modulator. Specifically, it is expected that short pulse widths are more prevalent and long pulse widths are unlikely.

Functionality of a noise-shaping ADC, such as a delta-sigma ADC that shapes the noise into the higher frequency bands can be verified by ensuring that the number of narrow pulse widths is greater than the number of wide pulse widths. A noise-shaping converter that shapes the noise into a particular frequency and/or pulse width band could be verified by evaluating the relative number of pulse widths corresponding to the frequency and/or pulse width band in which the noise is shaped relative to other frequency and/or pulse width bands.

Figure 24A:
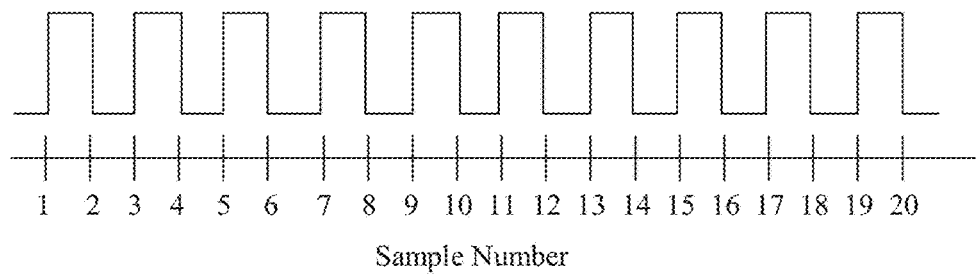
FIGS. 24A-D illustrate the maximum number of pulses of width W in a sequence of length N.
Figure 24B:
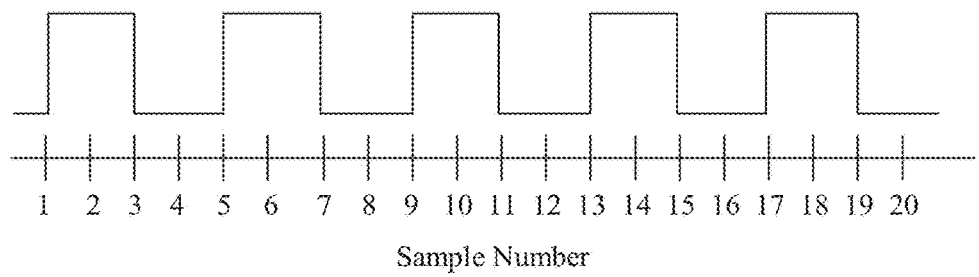
Figure 24C:
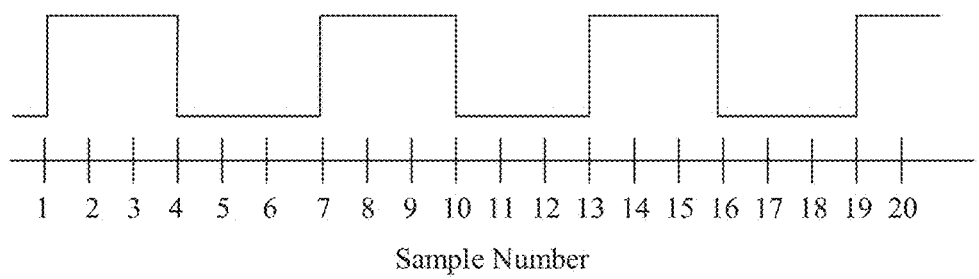
Figure 24D:
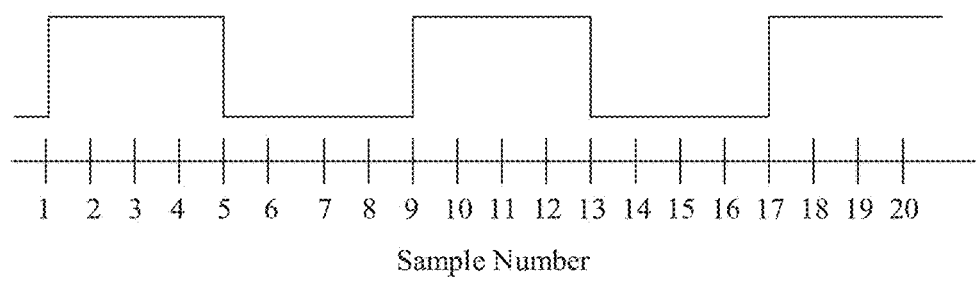

FIGS. 24A-D illustrate the maximum number of pulses of width W in a sequence of length N. Specifically, FIG. 24A shows that for a sequence or sample size of length 20, the maximum number of pulses with a width 1 is 19. FIG. 24B shows that the maximum number of pulses with a width 2 is 9. FIG. 24C shows that the maximum number of pulses with a width of 3 is 6. Finally, FIG. 24D shows that the maximum number of pulses with a width 4 is 5. In general, the number of pulses of a width W in a sequence of length N is:

$$P_{max} = \left\lfloor \frac{N-1}{W} \right\rfloor \quad \text{Equation 12}$$

Figure 25:
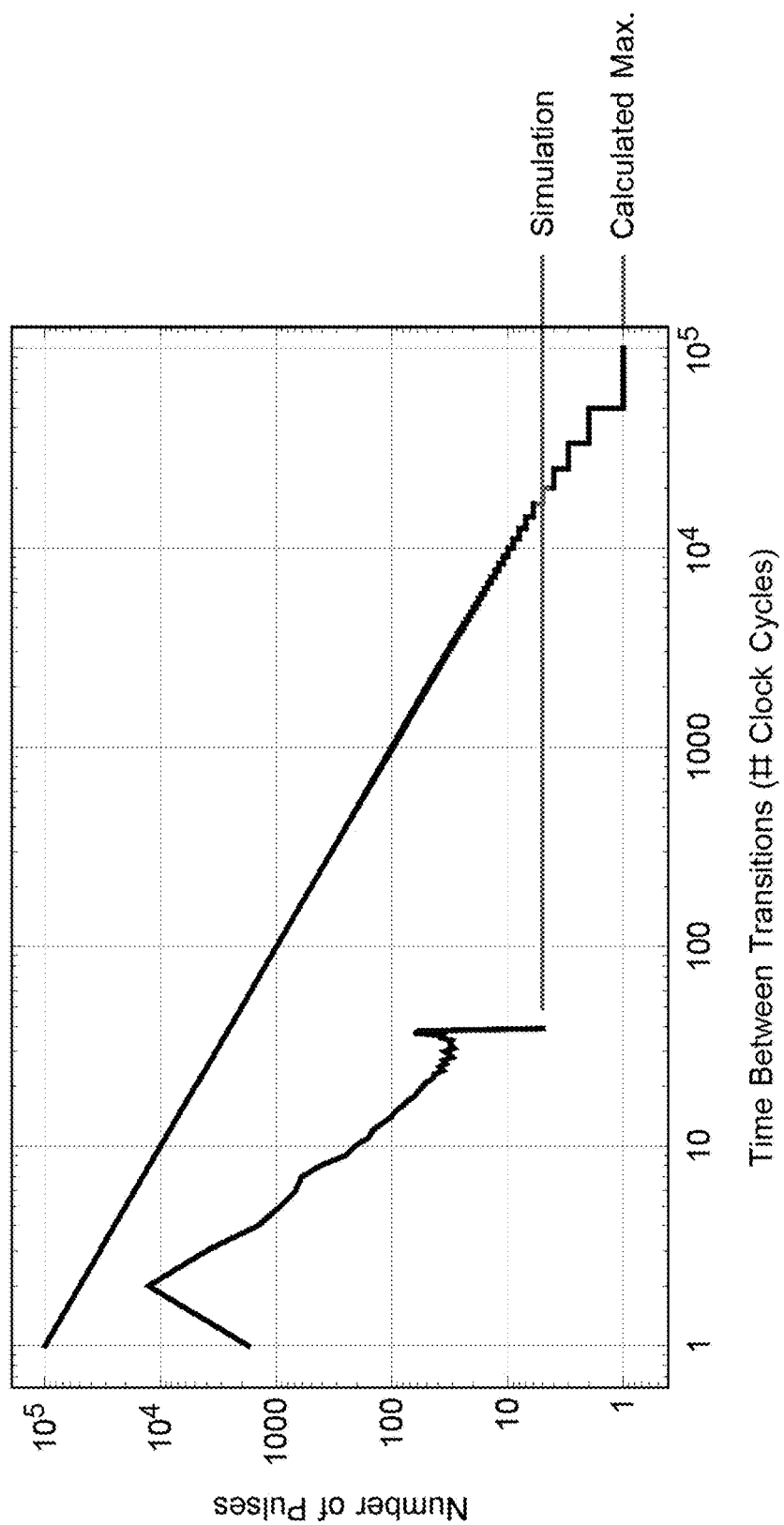
FIG. 25 illustrates a simulated count of the number of pulses with discrete lengths for a first order delta-sigma modulator and a plot of the theoretical maximums, according to one embodiment.

FIG. 25 illustrates a simulated count of the number of pulses with discrete lengths for a first order delta-sigma modulator and a plot of the theoretical maximums as described in conjunction with Equation 12, according to one embodiment. According to various embodiments, functionality and/or health of a noise-shaping ADC converter can be verified by evaluating the count of the number of pulses of various widths. For example, a transition detection module can detect transitions from 0 to 1 and/or from 1 to 0. One or more pulse counter modules can count the number of pulses of various lengths for a given sequence of samples.

Figure 26:
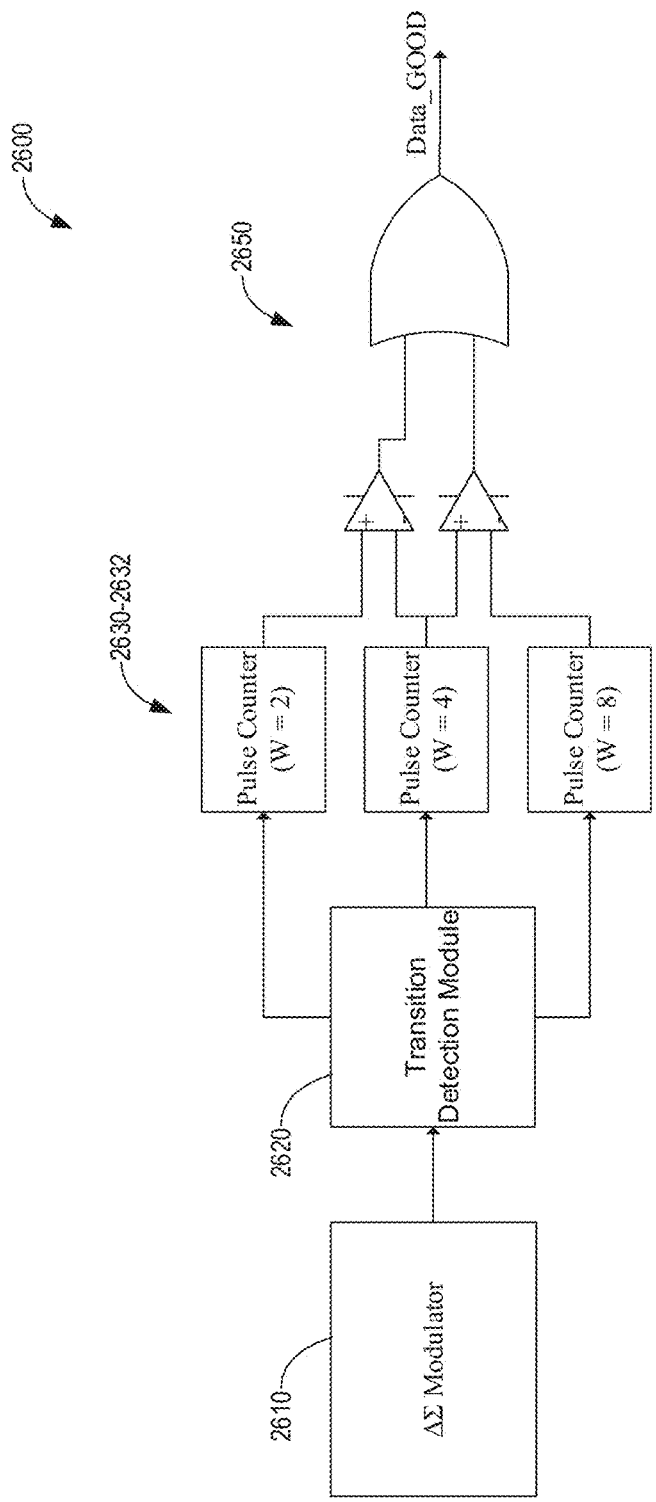
FIG. 26 illustrates a block diagram of an example of a circuit to detect an incorrect shape in modulation noise.

FIG. 26 illustrates a block diagram 2600 of an example of a circuit to detect an incorrect shape in modulation noise. As illustrated, the output of a delta-sigma modulator 2610 feeds a transition detection module 2620. One or more (illustrated discretely) pulse counters 2630-2632 count the number of pulses for each width (2, 4, and 8). Logic 2650 requires that the number of pulses with a width of 2 exceed the number of pulses with a width of 4, and that the number of pulses with a width of 4 exceeds the number of pulses with a width of 8. Logic 2650 ensures that if these noise shape characteristics (e.g., the number of short pulses should be greater than the number of wide pulses) are not met, then ADC verification fails.

Figure 27:
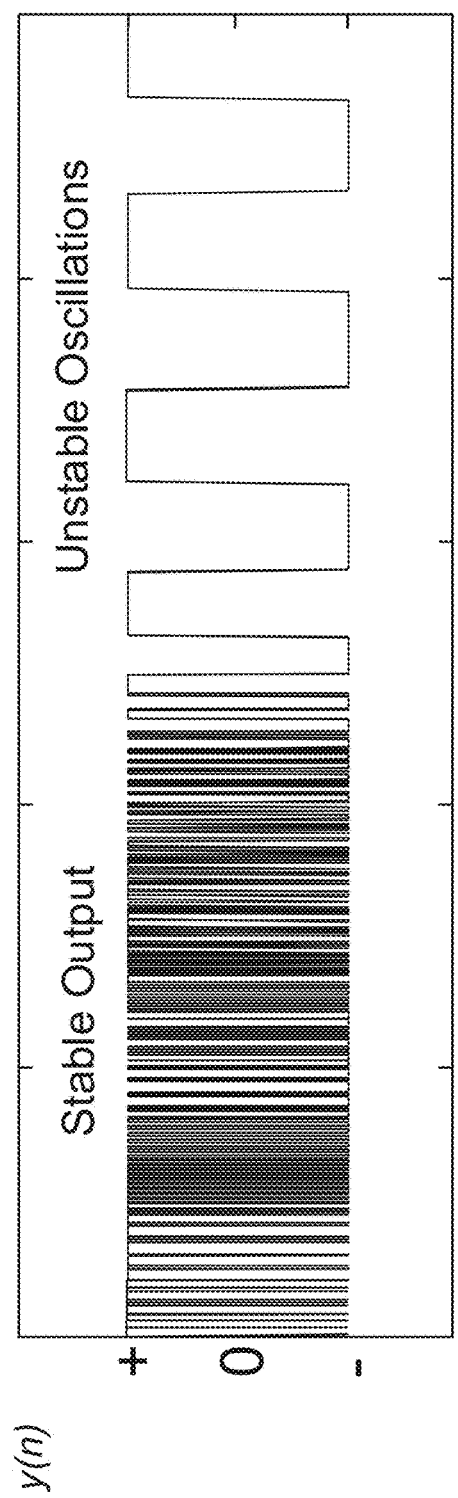
FIG. 27 illustrates a time evolution of an output y(n) for an unstable modulator with a sinusoidal input signal, according to one embodiment.

FIG. 27 illustrates a time evolution of a modular output y(n) for an unstable modulator with a sinusoidal input signal, according to one embodiment. As illustrated, instability is visually illustrated by the sudden loss of short width pulses. The block diagram 2600 of FIG. 26 can be used to detect instability.

Figure 28:
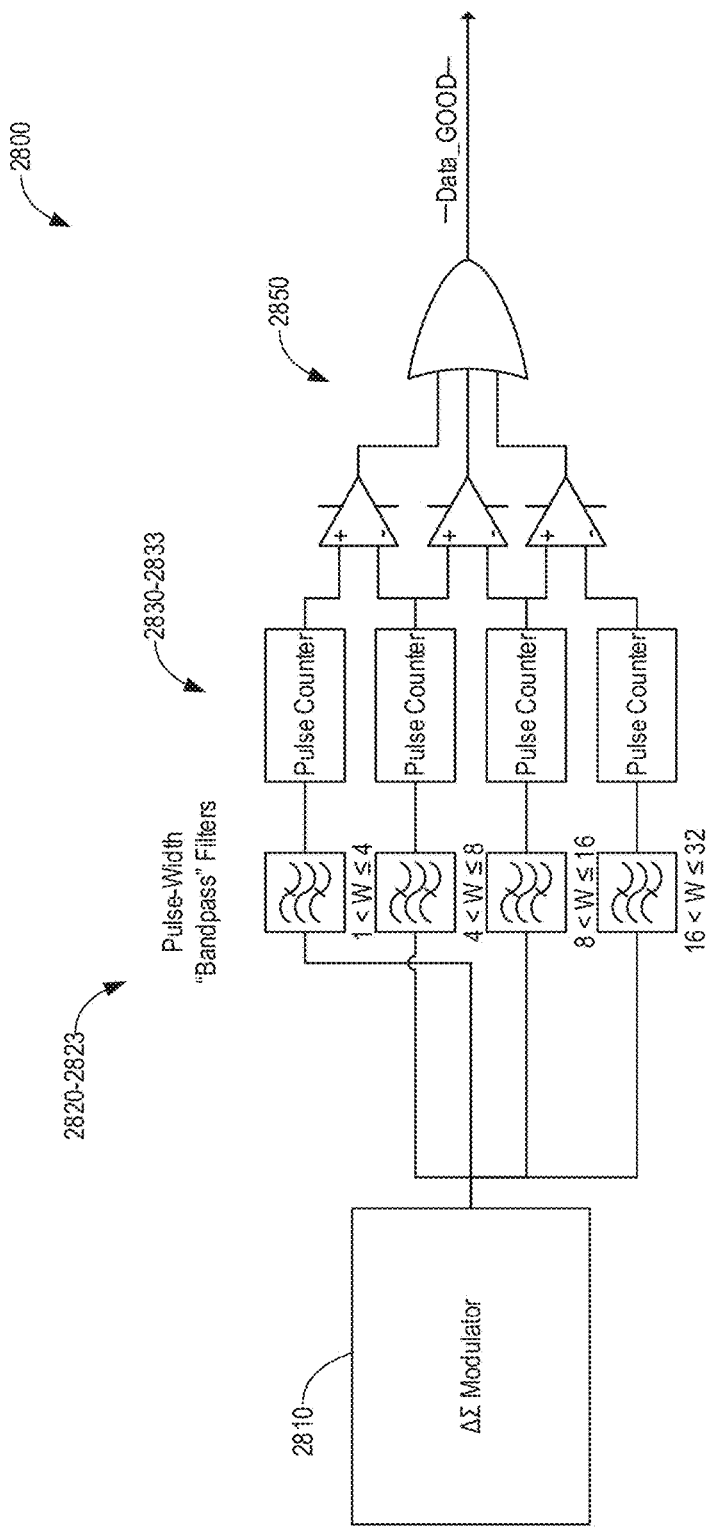
FIG. 28 illustrates a block diagram of an example of a circuit to count and compare the number of pulses within predefined pulse-width ranges.

FIG. 28 illustrates a block diagram of an example of a circuit to count and compare the number of pulses within predefined pulse width ranges. By analyzing transitions in the time-domain, ADC verification or failure identification can be implemented in the time domain instead of or in addition to the frequency domain. Using pulse width filters of a bandpass type (filters which detect pulses with widths W between two values), several pulse width "frequency regions" can be counted and compared. As illustrated, a plurality of pulse width bandpass filters 2820-2823 work with pulse counters 2830-2833 to count the number of pulses within each pulse "band" output by the delta-sigma modulator 2810. These pulse width "frequency regions" that include pulses with a specific, single width, or with widths between two values are referred to herein as "pulse width bands."

In the illustrated embodiment, the first "band" of pulses includes pulses with widths between 1 and 4. The second "band" of pulses includes pulses with widths between 5 and 8. The third "band" of pulses includes pulses with widths between 9 and 16. The fourth "band" of pulses includes pulses with widths between 17 and 32.

Because lowpass noise-shaping ADCs, such as delta-sigma ADCs, shape the noise into the higher frequencies, it may be expected that the number of pulses in the first band will exceed the number of pulses in the second band. Similarly, the number of pulses in the second and third bands will exceed the number of pulses in the third and fourth bands, respectively. Logic 2850 ensures that if these noise-shaping characteristics (e.g., the number of short pulses should be greater than the number of wide pulses) are not met, then ADC verification fails.

In the previously described embodiments, an identifiable characteristic (e.g., an RMS value associated with quantization noise and/or a number of pulses within a pulse width band) is compared to constant and/or dynamic thresholds and/or thresholds associated with other identifiable characteristics associated with other frequency and/or pulse width bands such that, if these noise-shaping characteristics (e.g., the number of short pulses should be greater than the number of wide pulses) are not met, then ADC verification may fail immediately following the first detection of an unexpected or incorrect noise-shaping characteristic. In some embodiments, additional and/or alternative verification approaches may be utilized. For example, some embodiments may employ alternative comparison schemes and/or ADC verification criteria. For example, an ADC failure may be declared if the noise-shaping characteristics are not met for some length of time (e.g., unexpected noise-shaping characteristics may be tolerated for a specified period of time before ADC verification fails).

Counting time between pulses is used in delta-sigma pulse-width modulation (PWM) circuits. As described above, pulse counting can be used to detect incorrect quantization noise properties in the output of an ADC in the frequency domain and/or the time domain, as per the examples of each provided above.

Figure 29:
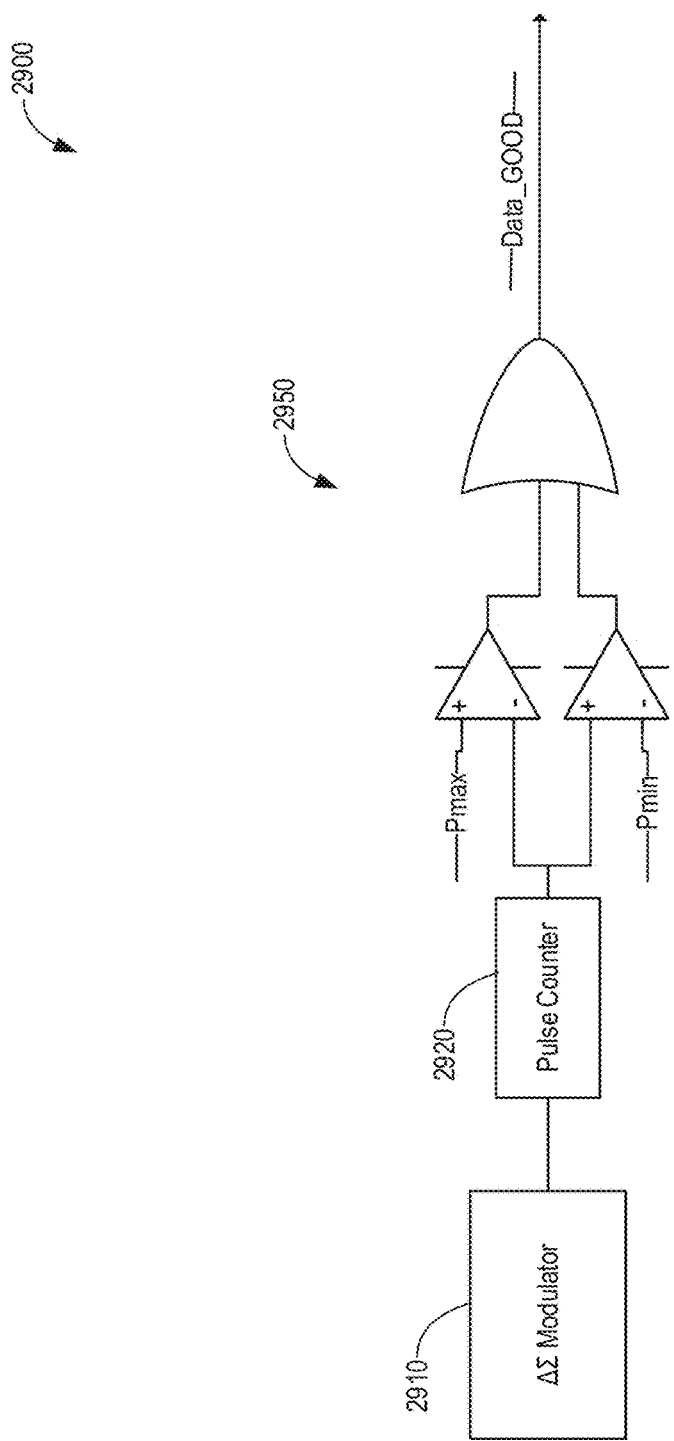
FIG. 29 illustrates an example of a circuit to detect the number of pulses for comparison with minimum and maximum limits.

FIG. 29 illustrates an example of a circuit 2900 to detect the number of pulses for comparison with minimum and maximum limits. Rather than a relative comparison between regions of the pulse width bandpass filters, as illustrated and described in conjunction with FIG. 28, threshold limits can be established for reach region. FIG. 29 illustrates a simplified circuit 2900 for a single pulse width comparison. A pulse counter 2920 may count the number of total pulses of a particular width or range of widths that are output from the delta-sigma modulator 2910 and compare the count with a threshold range that includes minimum and maximum threshold values 2950.

Additional pulse counters 2920 could be used for any number of pulse widths, each of which may be compared with unique minimum and maximum threshold values. In some embodiments, the minimum and maximum threshold values for the count of a particular pulse width may be based on an input magnitude signal, similar to the description provided in conjunction with FIG. 19 above. In still further embodiments, the minimum and maximum threshold values for the count of a particular pulse width may be based on an input frequency or other electrical or digital characteristic, and/or a temperature, humidity, and/or other environmental characteristic. Moreover, some embodiments may adjust the minimum and maximum threshold values based on a measurement associated with a type of ADC, ADC family, or even an individual ADC.

Thus, an error checking system for a noise-shaping ADC may include a pulse counter to determine the number of pulses in a sequence of pulses output by a noise-shaping modulator in a first pulse width band. Based on a determination that the number of pulses in the sequence of pulses within the first pulse width band is outside of a threshold range, an error identification subsystem may indicate an ADC error. Again, while many of the embodiments of the various comparison subsystems and error identification subsystems are described and illustrated using block diagrams and discrete components, it is appreciated that they may be embodied as one or more differential amplifiers, logic gates, software modules, ASICs, and FPGAs.

Moreover, as in previous embodiments, the noise-shaping modulator may be part of a noise-shaping ADC, such as a delta-sigma modulator. More complex and/or accurate error checking may be accomplished by calculating the number of pulses in third, fourth, fifth, etc. pulse width bands. Indicating an error may be accomplished by transmitting an error signal or ceasing to transmit a verification signal. Similar embodiments and adaptations to the illustrated and described embodiments may be utilized for one-bit noise-shaping modulators and multi-bit noise-shaping modulators alike. Moreover, first-order, second-order, third-order, etc. noise-shaping modulators may also be used.

Figure 30:
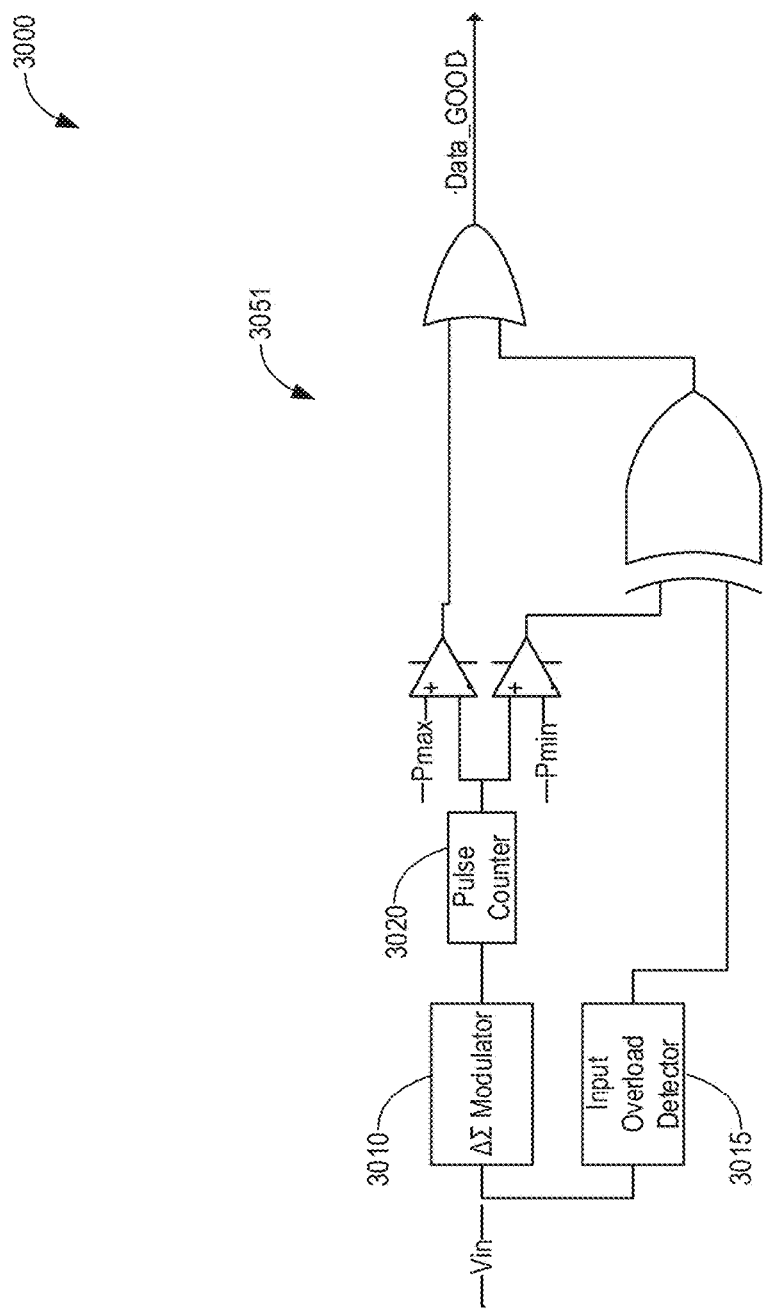
FIG. 30 illustrates an example of a circuit to detect the number of pulses and compare the number with minimum and maximum thresholds.

FIG. 30 illustrates an example of a circuit 3000 to detect the number of pulses output by the delta-sigma modulator 3010 via a pulse counter 3020 and compare the number with minimum and maximum thresholds 3051. The circuit 3000 further includes an input overload detector 3015. The input overload detector 3015 enables ADC overload detection. When a delta-sigma modulator becomes unstable, it can produce a string of output bits with the same logic level. Relatedly, when a noise-shaping ADC is overloaded, its output signal to quantization noise ratio decreases and the pulse-count comparisons described above may produce erroneous results. Accordingly, an input overload detector 3015 may be employed in any of the embodiments described herein to supervise the ADC error detection systems described herein.

While specific embodiments and applications of the disclosure are described above, it is to be understood that the disclosure is not limited to the precise configurations and components disclosed herein. For example, the systems and methods described herein may be applied to an industrial electric power delivery system, electric power delivery system implemented in a boat or oil platform that may or may not include long-distance transmission of high-voltage power, and/or a wide variety of other applications and systems that utilize ADCs. Accordingly, many changes may be made to the details of the above-described embodiments without departing from the underlying principles of this disclosure.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified and/or steps or actions may be omitted.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations. Thus, all feasible permutations and combinations of embodiments are contemplated.

Several aspects of the embodiments described may be implemented using hardware, firmware and/or software modules or components. As used herein, a module or component may include various hardware components, firmware code, and/or any type of computer instruction or computer-executable code located within a memory device and/or transmitted as transitory or non-transitory electronic signals over a system bus or wired or wireless network. Many of the embodiments described herein are shown in block diagram form and/or using logic symbols. It is appreciated that various elements of each of the illustrated and described embodiments could be implemented using FPGAs, custom application specific integrated circuits (ASICSs), and/or as hardware/software combinations.

In the description above, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations and combinations of the independent claims with their dependent claims.

What is claimed is:

1. A method for identifying errors in a noise-shaping analog-to-digital converter (ADC), comprising:
   identifying a first quantization noise characteristic of an output of a noise-shaping modulator within a first frequency band;
   identifying a second quantization noise characteristic of an output of the noise-shaping modulator within a second frequency band, wherein the first frequency band includes frequencies that are higher than at least some frequencies included in the second frequency band;
   comparing the first quantization noise characteristic associated with the first frequency band with the second quantization noise characteristic associated with the second frequency band; and
   indicating an ADC error based on a determination that the second quantization noise characteristic associated with the second frequency band is outside of a threshold relative to the first quantization noise characteristic associated with the first frequency band.

2. An error checking system for an analog-to-digital converter (ADC), comprising:
  at least one quantization noise evaluation module to identify:
    a first quantization noise characteristic of a signal generated by the ADC within a first frequency band, and
    the second quantization noise characteristic of a signal generated by the ADC within a second frequency band, wherein the first frequency band includes frequencies that are higher than at least some frequencies included in the second frequency band;
  a comparison subsystem to compare the first quantization noise characteristic associated with the first frequency band with the second quantization noise characteristic associated with the second frequency band; and
  an error identification subsystem to indicate an ADC error based on a determination that the first quantization noise characteristic associated with the first frequency band is outside of a threshold relative to the second quantization noise characteristic associated with the second frequency band.

3. The error checking system of claim 2, wherein the ADC comprises a noise-shaping ADC, and wherein the signal generated by the ADC comprises the output of a noise-shaping modulator.

4. The error checking system of claim 3, wherein the noise-shaping modulator comprises at least one of:
  a one-bit delta-sigma modulator,
  three-bit delta-sigma modulator, and
  a second order delta-sigma modulator.

5. The error checking system of claim 2, wherein the ADC comprises a successive approximation register (SAR) ADC.

6. The error checking system of claim 2, wherein each of the first and second quantization noise characteristics comprises a magnitude of the quantization noise within the respective first and second frequency bands.

7. The error checking system of claim 2, wherein each of the first and second quantization noise characteristics comprises a root-mean-square (RMS) value of the quantization noise associated with the respective first and second frequency bands.

8. The error checking system of claim 2, wherein the first quantization noise characteristics comprises a root-mean-square (RMS) value of the quantization noise associated with the first frequency band, and the second quantization noise characteristic comprises a magnitude of the quantization noise within the second frequency band.

9. The error checking system of claim 2, wherein the at least one quantization noise evaluation module is further configured to:
  identify a third quantization noise characteristic of a signal generated by the ADC within a third frequency band, wherein the third frequency band includes frequencies that are lower than at least some frequencies included in the second frequency band;
  wherein the comparison subsystem is further configured to compare the second quantization noise characteristic associated with the second frequency band with the third quantization noise characteristic associated with the third frequency band; and
  wherein the error identification subsystem is further configured to indicate an ADC error based on a determination that the second quantization noise characteristic associated with the second frequency band is outside of a threshold relative to the third quantization noise characteristic associated with the third frequency band.

10. The error checking system of claim 2, wherein the at least one quantization noise evaluation module comprises a distinct quantization noise evaluation module for each frequency band for which a quantization noise characteristic is identified.

11. The error checking system of claim 2, wherein the error identification subsystem is configured to indicate an ADC error by ceasing to provide a verification signal.

12. The error checking system of claim 2, wherein the error identification subsystem is configured to indicate an ADC error by transmitting an error signal.

13. The error checking system of claim 2, wherein each of the at least one quantization noise evaluation module comprises at least one of: a bandpass filter and an integrator.

14. The error checking system of claim 2, wherein the comparison subsystem comprises one of: (i) one or more differential amplifiers; (ii) a software module; and (iii) at least a portion of a field-programmable gate array; and
  wherein the error identification subsystem comprises one of: (i) one or more logic gates; (ii) a software module; and (iii) at least a portion of a field-programmable gate array.

15. An error checking system for an analog-to-digital converter (ADC), comprising:
  a first quantization noise evaluation module to identify a quantization noise characteristic of a signal generated by the ADC;
  a comparison subsystem to compare the quantization noise characteristic with a first threshold range bounded by at least one of a first minimum value and a first maximum value; and
  an error identification subsystem to indicate an ADC error based on a determination that the quantization noise characteristic is outside of the first threshold range.

16. The error checking system of claim 15, wherein the quantization noise characteristic comprises a frequency domain spectrum of the quantization noise of the signal generated by the ADC.

17. The error checking system of claim 15, wherein the quantization noise characteristic comprises a magnitude of the quantization noise within a first frequency band.

18. The error checking system of claim 15, wherein the quantization noise characteristic comprises a root mean-square (RMS) value of the quantization noise within a first frequency band.

19. The error checking system of claim 15, wherein the ADC comprises a noise-shaping ADC, and wherein the signal generated by the ADC comprises the output of a noise-shaping modulator.

20. The error checking system of claim 19, wherein the noise-shaping modulator comprises at least one of:
  a one-bit delta-sigma modulator,
  a three-bit delta-sigma modulator, and
  a second order delta-sigma modulator.

21. The error checking system of claim 15, wherein the ADC comprises a successive approximation register (SAR) ADC.

22. The error checking system of claim 15, further comprising:
  an input magnitude module to calculate a magnitude of an input signal to the noise-shaping modulator; and
  a noise limit calculation module to determine at least one of the first minimum value and the first maximum value based on the calculated magnitude of the input signal to the noise-shaping modulator.

23. The error checking system of claim 15, further comprising:
a noise limit calculation module to determine at least one of the first minimum value and the first maximum value based, at least in part, on at least one of: a temperature measurement, a frequency measurement, a characteristic of the ADC, a characteristic of an environment of the ADC, a characteristic of a system in which the ADC is employed, and a characteristic of an environment of a system in which the ADC is employed.

24. A method for identifying errors in a noise-shaping analog-to-digital converter (ADC), comprising:
calculating a quantization noise characteristic of an output of a noise-shaping modulator;
comparing the quantization noise characteristic with a first threshold range bounded by at least one of a first minimum value and a first maximum value; and
indicating an ADC error based on a determination that the calculated quantization noise characteristic is outside of the first threshold range.

* * * * *